(12) United States Patent
Kostrzewski et al.

(10) Patent No.: US 10,720,611 B2
(45) Date of Patent: Jul. 21, 2020

(54) NON-ELECTRICAL BATTERY BASED ON PLASTIC STRINGS AND MEMBRANES

(71) Applicant: Physical Optics Corporation, Torrance, CA (US)

(72) Inventors: Andrew Kostrzewski, Torrance, CA (US); Tomasz Jannson, Torrance, CA (US); Kang Lee, Torrance, CA (US); Richard Koziol, Torrance, CA (US); Kevin Walter, Torrance, CA (US)

(73) Assignee: PHYSICAL OPTICS CORPORATION, Torrance, CA (US)

( * ) Notice: Subject to any disclaimer, the term of this patent is extended or adjusted under 35 U.S.C. 154(b) by 278 days.

(21) Appl. No.: 15/666,039

(22) Filed: Aug. 1, 2017

(65) Prior Publication Data

US 2019/0044098 A1 Feb. 7, 2019

(51) Int. Cl.
| | | |
|---|---|---|
| *H01M 2/02* | (2006.01) | |
| *H01M 10/42* | (2006.01) | |
| *H01M 10/39* | (2006.01) | |
| *B81B 3/00* | (2006.01) | |

(52) U.S. Cl.
CPC ......... *H01M 2/0212* (2013.01); *B81B 3/0027* (2013.01); *B81B 3/0032* (2013.01); *H01M 10/3972* (2013.01); *H01M 10/4257* (2013.01)

(58) Field of Classification Search
CPC ........... H01M 2/0212; H01M 10/3972; H01M 10/4257; B81B 3/0027; B81B 3/0032
USPC ......................................................... 290/1 R
See application file for complete search history.

(56) References Cited

U.S. PATENT DOCUMENTS

| | | | | |
|---|---|---|---|---|
| 6,444,339 B1* | 9/2002 | Eshraghi | ............... | H01M 8/241 429/437 |
| 6,545,385 B2* | 4/2003 | Miller | ..................... | B81B 3/004 310/309 |
| 7,012,491 B1* | 3/2006 | Geisberger | ................. | B25J 7/00 200/181 |
| 9,502,734 B1* | 11/2016 | Lim | .................. | H01M 10/0436 |
| 2008/0170982 A1* | 7/2008 | Zhang | .................... | B82Y 10/00 423/447.3 |
| 2009/0288479 A1* | 11/2009 | Woody | ................ | B01F 11/0088 73/105 |
| 2012/0267900 A1* | 10/2012 | Huffman | ............. | H01L 41/1138 290/1 R |
| 2013/0146521 A1* | 6/2013 | Brozell | .................... | C02F 1/44 210/259 |
| 2013/0193930 A1* | 8/2013 | Baugher | ............. | H01L 41/1138 320/137 |
| 2014/0057147 A1* | 2/2014 | Andrew | ............ | H01M 10/0431 429/94 |
| 2015/0333361 A1* | 11/2015 | Sato | .................. | H01M 10/0404 29/623.1 |
| 2016/0195073 A1* | 7/2016 | Kellogg | .................. | F03G 7/065 290/1 R |

(Continued)

*Primary Examiner* — Viet P Nguyen
(74) *Attorney, Agent, or Firm* — Sheppard, Mullin, Richter & Hampton LLP

(57) ABSTRACT

A non-electrical battery can include a backing plate; a plurality of strings disposed in parallel relation on the backing plate, each string comprising a first end and a second end, wherein the first end of each string is attached to the backing plate and each string extends away from the backing plate; and a charging mechanism attached to the second end of each string to apply a force to the strings to increase a potential energy stored by the strings.

38 Claims, 18 Drawing Sheets

(56) References Cited

U.S. PATENT DOCUMENTS

| | | | |
|---|---|---|---|
| 2017/0250447 A1* | 8/2017 | Jiang | H01M 2/0202 |
| 2017/0302197 A1* | 10/2017 | Gutierrez | B81B 3/007 |
| 2018/0145367 A1* | 5/2018 | Busacca | H01M 2/021 |
| 2019/0131612 A1* | 5/2019 | Waller | B23K 1/0006 |

* cited by examiner

| Length l | 1 m | 10 cm | 1 cm | 5 mm | 3 mm | 1 mm | 300 μm |
|---|---|---|---|---|---|---|---|
| Area s | 5 mm x 5 mm | 0.5 mm x 0.5 mm | 2 mil x 2 mil (51 μm x 51 μm) | 1 mil x 1 mil | 10 μm x 10 μm | 5 μm x 5 μm | 1 μm x 1 μm |
| Resonance Frequency $f_o$ | 230 Hz | 2.3 kHz | 23 kHz | 46 kHz | 117 kHz | 351 kHz | 1.1 MHz |
| Area of Interest | Macro | Macro | MEMS | MEMS | MEMS | BIOL | BIOL |
| | Terrain Vehicles | | MEMS Structures | | | Biologic Structures | |

Fig. 13

NON-ELECTRICAL BATTERY BASED ON PLASTIC STRINGS AND MEMBRANES

TECHNICAL FIELD

The disclosed technology relates generally to non-electric batteries. More particularly, some embodiments relate to batteries based on strings or membranes.

DESCRIPTION OF THE RELATED ART

In 1749 Benjamin Franklin created a multi-plate capacitor that he used for his experiments with electricity. He referred to this capacitor as an electrical battery. It was a half a century later when Alessandro Volta invented what is thought of as a true electrical battery (as opposed to a capacitor). Volta referred to this creation as a voltaic pile. Volta's voltaic pile was made of alternating copper and zinc discs stacked together and separated by an electrolyte. The discs were separated by a layer of cloth soaked in brine (i.e., the electrolyte). Volta's battery produced continuous electricity with a stable current, and maintained its charge when not in use.

Contemporary electrical batteries are made from a variety of chemicals that interact to create electricity. Some of these chemicals, such as cadmium, cobalt, lead, and nickel, are extremely toxic and can cause damage to humans and the environment. In particular, they can cause soil and water pollution and endanger life. When electrical batteries degrade, heavy metals can escape and pollute the air, soil and groundwater. Accordingly, proper recycling of most electrical batteries is required. Likewise, acid as an electrolyte in some batteries is corrosive and can cause injury if released, and lead-acid batteries are prone to releasing hydrogen gas, which is highly flammable.

Additionally, due to the harmful nature of the materials inside electrical batteries, the structures used to house the materials (i.e., the battery cases) tend to be engineered to reduce the risk of breach and leakage. Accordingly, these structures are expensive and add a lot of extra weight to the battery. This in turn, creates the risk of injury and increases the weight of the vehicle or other device powered by the battery.

BRIEF SUMMARY OF EMBODIMENTS

Various embodiments of the disclosure include non-electrical battery technology. In other embodiments, a non-electrical battery includes a backing plate; a plurality of strings disposed in parallel relation on the backing plate, each string comprising a first end and a second end, wherein the first end of each string is attached to the backing plate and each string extends away from the backing plate; and a charging mechanism attached to the second end of each string to apply a force to the strings to increase a potential energy stored by the strings.

In various embodiments, the non-electrical battery may further include a second plate, wherein the second end of each string is attached to the second plate; and wherein the charging mechanism is indirectly attached to the second end of each string via the second plate. The charging mechanism may include a ratchet mechanism to apply tension to the plurality of strings.

The amount of tension applied to a string of the plurality of strings in various embodiments, may extend the string by an amount within the range of $0.75 \cdot A$ to $A$, where $A = \varepsilon \cdot l$, wherein $\varepsilon$ is an elasticity of the string and $l$ is the unstretched length of the string. In some embodiments, $\varepsilon$ is in the range of 0.1-0.6. In other embodiments, $\varepsilon$ is in the range of 0.4-0.5. $\varepsilon$ may be given by $$\varepsilon = \left(\frac{\Delta x}{x}\right)_{MAX}.$$

The potential energy stored by the strings may be $$E = \frac{kA^2}{2} = \frac{k\varepsilon^2 l^2}{2}.$$

The charging mechanism may include a plurality of front plates, and each of the plurality of front plates is attached to a second end of a set of one or more of the plurality of strings. The charging mechanism may further include a plurality of ratchets, wherein each ratchet of the plurality of ratchets is attached to a corresponding plate of the plurality of front plates to draw the corresponding plate away from the backing plate by a determined distance. In some embodiments, each ratchet can draw its corresponding plate away from the backing plate by a distance that is different from the distance applied by the other ratchets of the plurality of ratchets.

The strings may include a plurality of filaments, wherein one of the filaments may include at least one of graphene, carbon fiber, plastic, steel, and nylon. The strings may be wound in a winding of radius, R.

In some embodiments, the strings may include a material having an elasticity, $\varepsilon$, of 0.4, a material density of $\rho = 1.1$ g/cm$^3$, and a Young's modulus of $30 \cdot 10^{11}$ N/m$^2$. In further embodiments, the strings may include a material having an elasticity of $\varepsilon$ in the range of 0.3 to 0.8, a material density of $\rho$ in the range of 0.7 to 1.4 g/cm$^3$, and a Young's modulus in the range of $2 \cdot 10^{10}$ to $30 \cdot 10^{11}$ N/m$^2$. In some embodiments, the strings may include at least one of graphene, carbon fiber, plastic, steel, and nylon. In still further embodiments, the strings may include a material having a Young's modulus in the range of $0.7 \cdot 10^{11}$ to $2 \cdot 10^{11}$ N/m$^2$.

The efficiency of the battery may be in the range of $\eta_2 = 0.9$ kWh/kg to $\eta_2 = 1.1$ kWh/kg. In other embodiments, the efficiency of the battery may be in the range of 1 to 20 kWh/kg.

In some embodiments, the strings may be arranged in a matrix to form a membrane having a length and a width, wherein the length may be between 80 and 120 times the length of each string and the width may be between 10 and 120 times the length of each string. In further embodiments, the non-electrical battery may be formed in the shape of a panel of fabric. In still further embodiments, the strings and backing plate may be arranged to form a membrane having a length and a width greater than a thickness, and the non-electrical battery may be formed into a sheet or fabric. In various embodiments, the sheet or fabric may be formed into a panel of an article of clothing, a seat cover a vehicle headliner, a curtain, a shade a carpet, bedding, or a liner.

In yet additional embodiments, the strings may be arranged in a matrix to form a membrane having a length, a width and a thickness of dimensions such that the non-electrical battery may be in the form of a sheet-like structure. The strings may be arranged in a matrix to form a membrane having a surface area between 0.8 and 1.2 m$^2$.

The length of the strings may be in the range of 0.8 to 1.1 cm, the strings have a Young's modulus in the range of $10^{11}$ N/m² to 2·10¹¹ N/m². In other embodiments, the length of the strings may be in the range of 0.8 to 1.1 cm, the strings have a Young's modulus in the range of 2·10⁹ N/m² to 2.3·10⁹ N/m². In yet other embodiments, the strings may include material with a Young's modulus in the range of 2·10⁷ N/m² to 2.3·10¹¹ N/m², a material density in the range of 0.8 g/cm³-1.3 g/cm³ and an elasticity in the range of 0.1 to 0.6. In yet other embodiments, the strings may comprise material with a Young's modulus in the range of 27·10¹¹ to 32·10¹¹ N/m², a material density in the range of 0.8 g/cm³-1.3 g/cm³ and an elasticity in the range of 0.1 to 0.6.

The energy that can be stored in the non-electrical battery may be a function of an elasticity coefficient of the string material. The energy that can be stored in the non-electrical battery may be given by $$E = \frac{HS\varepsilon^2 l}{2},$$

where H may be the Young's modulus of the strings, S may be the surface area, ε may be the elasticity of the strings, and l may be the length of the strings.

The efficiency of the non-electrical battery may be a function of an elasticity of the strings. The efficiency of the non-electrical battery may be given by $$\eta = \frac{\frac{\varepsilon^2 l^2}{2} \frac{H \cdot S}{l}}{\frac{\rho S \cdot l}{1}} = \frac{\varepsilon^2 H}{2} \frac{1}{\rho} = \frac{\varepsilon^2 H}{2\rho},$$

where H may be the Young's modulus of the strings, ε may be the elasticity of the strings, and ρ may be the material density of the strings g/cm³.

The strings may include a plastic. The strings each may include a plurality of filaments and the filaments may include two or more materials chosen from the group of plastic, steel, graphene, butyl rubber, neoprene, polyurethane, plexiglass, vinyl, and nylon. The strings may be selected such that a natural resonant frequency of the strings may be sufficiently far from a frequency of vibrations encountered in an application of the non-electrical battery such that the vibrations encountered do not interfere with energy storage of the strings in the non-electrical battery. In some embodiments, the strings may include a composite plastic with a Young's Modulus greater than 10¹⁰ N/M².

The strings of the non-electrical battery have a resonant frequency in the range of 18-25 kHz. In other embodiments, the strings of the non-electrical battery may have a resonant frequency in the range of 3 kHz-1.1 Mhz. The non-electrical battery may have a resonant frequency given by $$\omega_o^2 = \frac{H}{\rho \cdot l},$$

where H may be the Young's modulus of the strings, ρ may be the material density of the stings and l may be the length of the strings.

The energy that can be stored in the non-electrical battery may be given by $$E_2 = \frac{NGd^6 \varepsilon^2 n}{128 R^3},$$

where ε may be the elasticity of the strings, d may be the diameter of the strings, n may be the number of turns in the windings, N may be the number of strings and G may be the shear modulus of the windings. The energy that can be stored by a string in the non-electrical battery may be governed only by material constants of the string.

The non-electrical battery, for α=5%, in some embodiments has an efficiency of $$\eta_1 = \frac{\varepsilon^2 H}{2\rho_1(1+\alpha)} = \frac{(0.6)^2 \cdot 2 \cdot 10^{11} \text{ N/m}^2}{2 \cdot 1.1 \text{ g/cm}^3(1+0.05)} == \frac{0.16 \cdot 2 \cdot 10^{11} \text{ N/m}^2}{2 \cdot 10^3 \text{ kg/m}^3(1.05)} =$$

$$0.15 \cdot 10^8 \text{ N} \cdot \text{m/kg} =.$$

$$= 1.5 \cdot 10^7 \text{ N} \cdot \text{m/kg} = 4166 \text{ Wh/kg}$$

A non-electrical MEMS battery may include a plurality of textural members arranged in parallel relation to one another, wherein the plurality of textural members are between 300 μm and 1 cm in length.

A non-electrical MEMS battery may include a first member having a first major surface and a second major surface, a second member having a first major surface and a second major surface, a plurality of textural members attached to and connected between a major surface of the first member and a major surface of the second member. In various embodiments, the first and second major surfaces may include a flexible material.

The may include a charging mechanism attached to the second major surface to exert a tension on the textural members to charge the non-electrical battery. The non-electrical battery may include a converter to convert potential energy released from the battery into electrical energy.

A non-electrical MEMS battery may include a plurality of textural members attached to a membrane and arranged in parallel relation to one another, wherein membrane and plurality of textural members form a brush.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 13 is a chart illustrating resident frequencies for a variety of structures.

Figure 1:
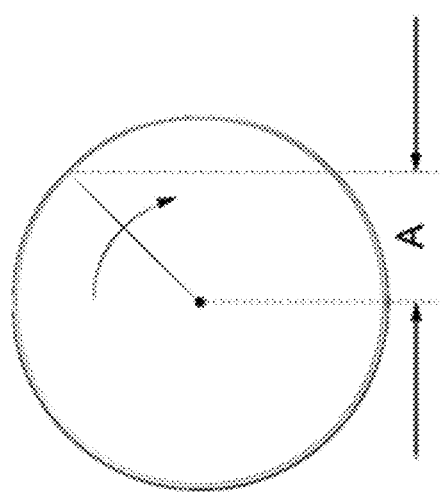
FIG. 1 is a diagram illustrating a simple example of a secondhand in rotation on a clock face.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology disclosed herein are directed toward devices and methods for providing non-electrical batteries that can be used to store and provide energy to operate devices. More particularly, embodiments of the technology disclosed herein provide a new concept for a non-electrical batteries that may employ texture, such as, for example, strings and membranes (formed from a matrix of textures), to store energy. In some embodiments, at least one of strings and membranes can be provided as a MEMS (micro-electromechanical systems) or a micromachines structure to store energy, and release energy in a controlled manner. Although MEMS devices may generally include electronic components such as, for example, processors and sensors, embodiments of the non-electrical MEMS batteries can be entirely mechanical devices. Other embodiments of the non-electrical MEMS batteries may include electrical or electromechanical components such as, for example, an energy conversion device (e.g., a generator) to convert the stored non-electrical potential energy into a voltage or current source, or a mechanical or electromechanical "charging" mechanism to cause non-electrical energy to be stored in the non-electrical battery.

From simple theories of dynamics, energy is power multiplied by time, and power is force times velocity. Accordingly, a MEMS battery's potential energy can be quantified as a function of its kinematic energy and dissipation. Accordingly, a non-electrical MEMS battery's potential energy can be defined as:

$$E_p = F_a \cdot v \cdot t + D \quad (1)$$

where: $E_p$ is potential string energy, D is a dissipation term, $F_a$ is an attenuation force (e.g., a dumping force in oscillator), v is velocity, and t is time. This equation will have general applicability to a non-electrical battery for a variety of different applications and can be applied, for instance, to the example walking robot discussed from time to time herein.

Because the right side of Eq. (1) is the same for all kind of batteries, the left side is also the same. Accordingly, a non-electrical MEMS battery's potential energy can be written as:

$$E_p = \eta m \quad (2)$$

where: η is the efficiency, m is the mass of the strings and membranes in the non-electrical battery.

Comparing electrical and non-electrical batteries, yields:

$$\eta_M \cdot m_M = \eta_E \cdot m_E \quad (3)$$

Where $_M$ references a non-electric (e.g., mechanical) battery and $_E$ references an electrical battery.

Embodiments may be implemented using texture materials (e.g., strings and membranes) with sufficiently high string energy such that their potential energy can exceed that of electro-chemical batteries by factor of as much as 10:1, or 100:1, or higher.

The concepts disclosed herein refer to elementary machines (Archimedes, 200 BC), and such military devices as middle age arbalest, based on a windlass, or other elementary machine. The first would be electrical energy in W hours, converted to string energy through a kind of arbalest with much lower mass.

Consider the case of an oscillator with attenuation force, $F_a$:

$$F_a = \alpha \dot{x} \text{ where; } \dot{x} = \frac{dx}{dt} \quad (6ab)$$

Thus, the oscillator equation, with a dumping force, $F_a$, has the form:

$$m\ddot{x} + \alpha\dot{x} + kx = 0 \quad (7)$$

with:

$$\frac{k}{m} = \omega^2; \quad \frac{a}{m} = 2\lambda \quad (8ab)$$

leading to:

$$\ddot{x}+2\lambda\dot{x}+\omega^2 x=0 \quad (9)$$

The motoric power, P, is given by $$P=F_a \cdot v; \text{ and } v=\dot{x} \quad (10ab)$$

with:

$$k=m\omega^2; \text{ and } E_k=\frac{mv^2}{2} \quad (11ab)$$

The potential string energy, is given by $$E_p=\frac{k\Delta x^2}{2}=\frac{m\omega^2 \Delta x^2}{2}, \quad (12)$$

and Eq. (1) becomes $$E_p=\frac{kA^2}{2}=\frac{m\omega^2 A^2}{2}=F_a \cdot v \cdot t + D \quad (13)$$

FIG. 1 is a diagram illustrating a second hand of a watch that makes one full rotation every 1 minute=60 sec. For discussion purposes, assume that A=2 cm, t=1 month.

$$T=1 \text{ min}, \omega=\frac{2\pi}{T}, \quad m=10 \text{ g} \quad (14)$$

$$1 \text{ month}=30.5 \text{ days}; \quad (15)$$
$$30.5 \times 24 \times 3600 \text{ sec}=2,635,200 \text{ sec/month}$$

$$\omega=\frac{2\pi}{T}=\frac{2\pi}{60 \text{ sec}} \cong 0.1/\text{sec} \quad (16)$$

$$E_p=\frac{10^{-3} \text{ kg} \cdot 2 \cdot 10^{-2} \text{ m}}{2}=10^{-5} \text{ Wsec}=10^{-5} \text{ J} \quad (17)$$

Thus, $10^{-5}$ J is sufficient to turn second hand of this example mechanical watch over a one month period.

In order to generalize to a distributed case, the following transformations (algebra→analysis) can be used:

$$m \Rightarrow dm \quad (18)$$

$$dm=\rho_l dx \text{—STRING}, x\text{-string length} \quad (19)$$

$$dm=\rho_s ds \text{—MEMBRANE} \quad (20)$$

where:

$$S\text{—membrane area} \quad (21)$$

and:

$$\rho_l\text{—linear density of string} \quad (22)$$

$$\rho_s\text{—area density of membrane} \quad (23)$$

Accordingly, embodiments of the non-electrical battery can be configured to use a texture material with a sufficiently large string energy. Various embodiments are implemented using a string material or membrane with sufficiently large string energy such that their q produces a sufficiently high value.

With continued reference to FIG. 1, there is a difference between the two lossy terms, $F_a$ and D, in Eq. (1) in this example. Particularly, $F_a$ references an internal loss for the second hand, while D references external dissipation losses. The external losses can be large, such as 30%, for example. In Eq. (1), stable conditions are contemplated in which v=constant and $F_a$=constant.

Work is generally understood as force times distance. The work done by a constant force of magnitude F is:

$$W=F \cdot l \quad (24)$$

Where W is work, F is the force applied, and l is the path distance of displacement. Because distance can be expressed as velocity x time:

$$l=v \cdot t \quad (25)$$

Thus, work, W, can be expressed as:

$$W=F \cdot l=F \cdot v \cdot t = P \cdot t \quad (26)$$

where $$P=F \cdot v \quad (27)$$

which explains Eq. (1).

In its original form, the oscillator equation, is:

$$m\ddot{x}+\beta\dot{x}+kx=0 \quad (28)$$

In this form, there are three constants. However, only two constants are independent. This is because equation (28) is the differential of the $2^{nd}$ order:

$$\ddot{x}+\frac{B}{m}\dot{x}+\frac{k}{m}x=0 \quad (29)$$

or $$\ddot{x}+2\varepsilon\dot{x}+\omega_0^2 x=0 \quad (30)$$

where:

$$\omega_0^2=\frac{k}{m}, \frac{\beta}{m}=2\varepsilon \quad (31 \text{ a,b})$$

Therefore, the solution for the variable, x, is $$x=A \sin(V-\omega_0 t+\phi) \quad (32)$$

where $\omega \cong \omega_0$ and V is the resonant frequency. The $1^{st}$ constant, is amplitude, A, and the constant is phase (phase $\phi=0$); thus $$x=A \sin \omega_0 t \quad (33)$$

It is useful to discuss a few numerical examples to better illustrate these concepts. Returning to Eq. (1), it can be written in the form:

$$E_{el}=F_{active} \cdot v \cdot t + D \quad (34)$$

According to the Newton's third law of motion, forces between two objects exist in equal magnitude and opposite direction (i.e., $F_A=-F_B$). Consequently, $$F_{active}=F_a \quad (35)$$

where $F_{active}$ is the active force coming from outside in order to compensate the attenuation force, $F_a$.

Example 1

Consider again the small-watch hand described above with reference to FIG. 1. Further consider the situation in which 1 watt hour (Wh) is needed to move the small-watch second hand over a 1 month period (i.e., $E_{el}$=1 Wh). The number of 1 Wh is an example only, but it can be compared to an electrical watch. Then, assume D=0, otherwise more energy is needed to compensate (for example in some cases D=30%).

Now, given t=1 month, v=A·$\omega_o$, A=2 cm (per the example in FIG. 1), $\omega_0$=

$$\frac{2\pi}{60 \text{ sec}},$$

what is attenuation force $F_a$?

$$E_l = F_a \cdot v \cdot t \quad (36)$$

solving for the attenuation force $F_a$ yields:

$$F_a = \frac{E_\ell}{v \cdot t} \quad (37)$$

$$t = 30.5 \text{ days} \cdot 24 \text{ hours} \cdot 3600 \text{ sec} \quad (38a)$$

$$v = 2 \cdot 10^{-2} \text{ m} \cdot \frac{2\pi}{60 \text{ sec}}. \quad (38b)$$

The transformations in Eqs. (38 a,b) are done in order to normalize all units to the SI-system. Then, the result will be also in the SI-system.

$$t = 2,635,200 \text{ sec} \quad (39a)$$

$$v = 2 \cdot 10^{-3} \text{ m/sec} \quad (39b)$$

$$F_a = \frac{3600 \text{ W sec}}{2 \cdot 1.0^{-3} \text{ m/sec}} = 1800 \cdot 10^3 = 1.8 \cdot 10^6 N \quad (39c)$$

Then, the attenuation force, $F_a$, is $1.8 \cdot 10^6$ N.

Example 2

Figure 2:
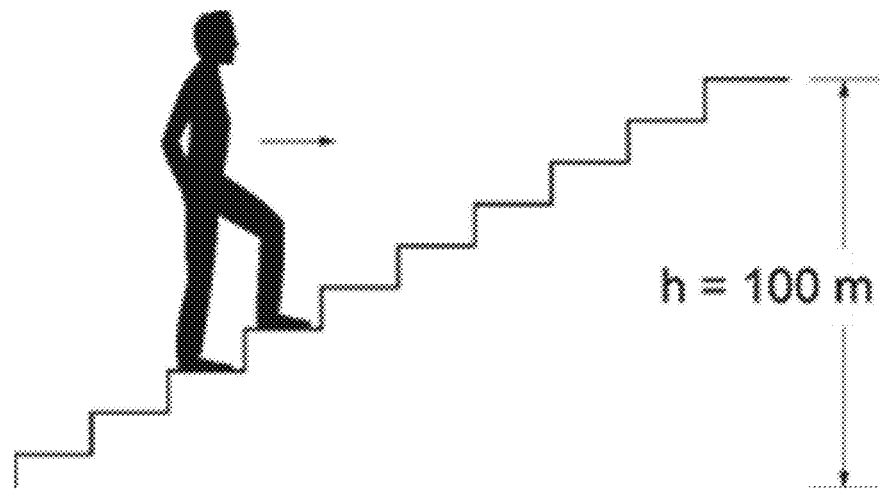
FIG. 2 is a diagram accompanying example 2, which shows the amount of energy expended to climb a very long flight of stairs.

Example 2 is described with reference to FIG. 2, which illustrates an example of person walking up a flight of stairs that is 100 m high. This example calculates the amount of energy that is needed for this hypothetical person to climb very long set of stairs (h=100 m), assuming D=0, and that regular walking force can be ignored.

Then, $E_l$=mgh, assuming:

$$m = 70 \text{ kg}, \quad (40)$$

$$E_\ell = 70 \text{ kg} \cdot 9.81 \text{ m/s}^2 \cdot 100 \text{ m} = 686.7 \cdot 100 = 68,$$

670 W sec = 19 Wh

Example 3. Electrical Battery Example

Assume an electrical battery with the following parameters:

Type: Rechargeable battery

Size: 4 cm×2 cm×1 cm=8 $cm^3$

Capacity: 900 mAh

Voltage: 9 V

Power: 0.9 Ah·9 V=8 Wh

Density: 4 $g/cm^3$

Weight: 8 $cm^3$×4 $g/cm^3$=32 g

Efficiency: 8 Wh/32 g=0.25 kWh/kg.

Figure 3:
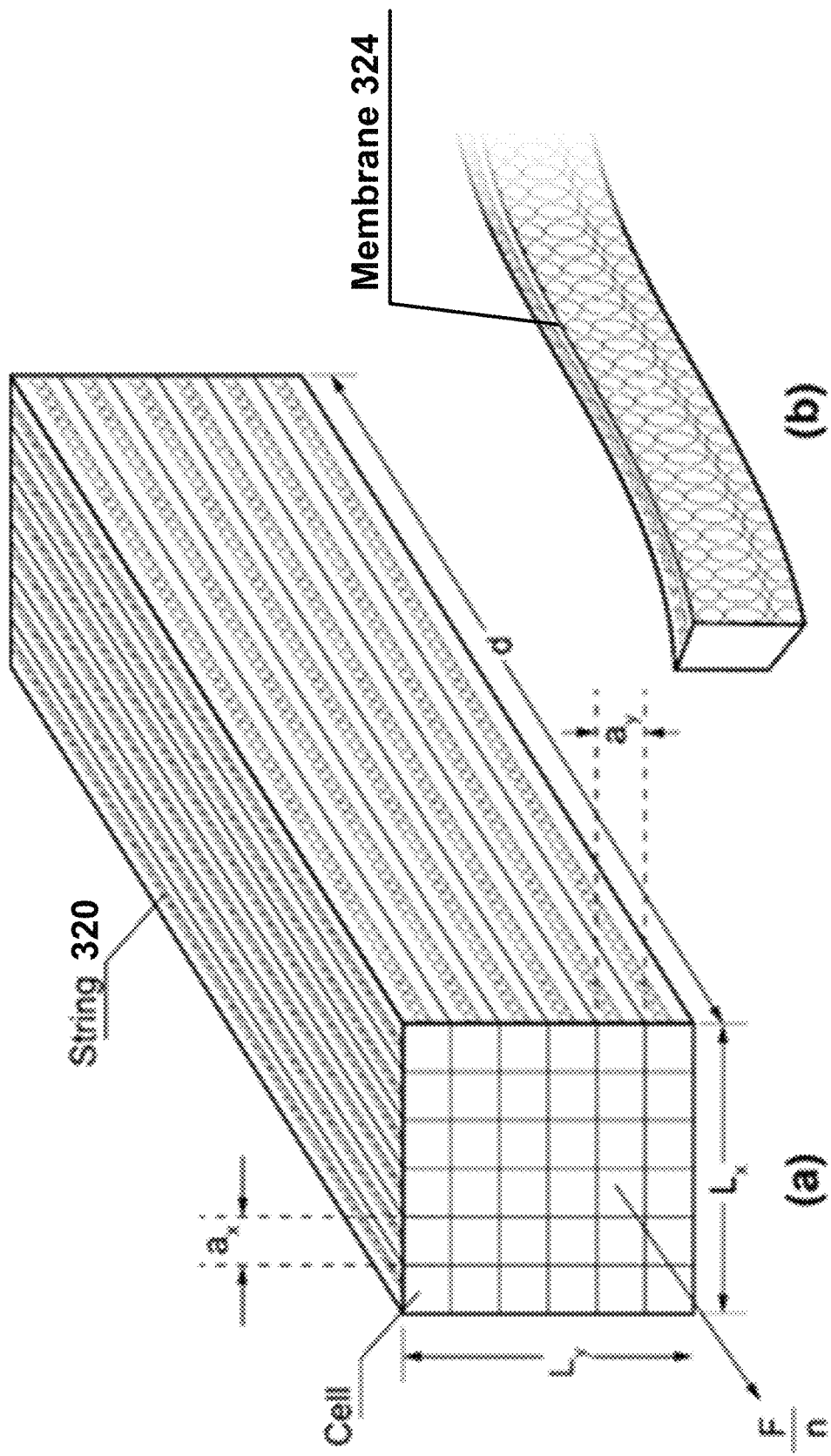
FIG. 3 is a diagram illustrating an example concept of MEMS cells, including example strings and membranes in accordance with embodiments of the disclosed technology.

FIG. 3 illustrates an example of a membrane and strings in accordance with one embodiment. Both strings 320 (FIG. 3 (a)) and membranes 324 (FIG. 3 (b)) are presented in the examples of FIG. 3.

In the illustrated example, string 324 is an elongate member having a length that is greater than its cross-sectional dimensions. Embodiments can include multiple strings 324 combined together such as, for example, in a membrane 320. Likewise, membrane 320 has a length, d, that is much greater than its cross-sectional dimensions, $L_x$ and $L_y$. In various embodiments either or both of these two textures can be configured in a housing and attached to the housing or other mounting mechanism such that the textures can be loaded to store mechanical potential energy. In other embodiments, a housing is not used and the texture(s) may be configured and attached relative to other structures so that the texture(s) can be loaded to store the energy to charge the non-electrical battery. As described in further detail below, this potential energy can be stored by applying a load to the material and to take advantage of the material's elastic deformation properties in a linear case or non-linear (i.e., to take advantage of an elastic, linear or non-linear response).

Both k-coefficients and m-masses are added. It is assumed that Hooke's law: F=kx is satisfied for expanded forces.

Then, n=$n_x \cdot n_y$ $$n_x = \frac{L_x}{a_x}, n_y = \frac{L_y}{a_y}, \quad (41)$$

For the quadratic case:

$$L_x = L_y = L_1, \text{ and } a_x = a_y = a \quad (42 \text{ a,b})$$

Where $L_x$ and $L_y$ are the cross-sectional dimensions of the string 320, and $a_x$ and $a_y$ are the cross-sectional dimensions of a membrane 324. Thus, where $n_x = n_y$ (assumed for the case of simplicity):

$$n = n_x n_y = n_x^2.$$

One challenge is with MEMS miniaturization. If each cell has only 1 mil×1 mil dimensions, there are $10^6$ cells per square inch. Table 1 shows the number of units, n, for dimensions for units of different sizes for a cell of 1 mil×1 mil dimensions.

TABLE 1

| | Related Dimensions for 1 mil × 1 mil Cells | | | | |
|---|---|---|---|---|---|
| $L_x$ | 1 inch | 2 inch | 3 inch | 5 inch | 10 inch |
| $L_x$ | 2.54 cm | 5.08 cm | 7.62 cm | 12.7 cm | 25.4 cm |
| n | $10^6$ | $4 \cdot 10^6$ | $9 \cdot 10^6$ | $25 \cdot 10^6$ | $10^8$ |

In various embodiments, the cover of the non-electrical MEMS Strings and Membranes (MSMs) batteries can be made of a non-metallic material because the system is not toxic as in the case of electric batteries. This can allow a weight saving advantage and the kWh/kg-efficiency will be automatically higher as a result.

For MSM cells, a global formula that can be used is $$\frac{k}{m} = \frac{\sum k_i}{\sum m_i}, \tag{43}$$

where $k_i$ are string constants for cells, $m_i$ are their masses, and k and m are their global efficiencies.

In various embodiments, an elementary machine such as an arbalest, windlass, winch, or ratchet for example, may be used for energy transfer from the electrical case to the mechanical case. Then, an inverse process may be used using such elementary machines as hydraulic press and those used for yachting. Carbon strings (graften) may be used for highly stiff strings (large k-values), where also we need to have maximum linear regime of $k_x$.

Hooke's law states that the amount of force needed to extend or compress a spring is proportional to the distance by which the spring is extended or compressed. Hooke's law can be stated as F=k·x, where k is the spring's stiffness (a constant) and x is the displacement, or the distance by which the spring will be extended or compressed. Hooke's law has been extended as a first-order linear approximation to other situations of elastic body or material deformation.

There is an analogy, to some extent, between Hooke's law and Ohm's law, as a linear approximation. Ohm's law provides that the current through a conductor is directly proportional to the voltage across that conductor and is given by the equation V=IR. Table 2 provides the variables in Hooke's law and Ohm's law.

TABLE 2

| V | ⇔ | F |
|---|---|---|
| R | | k |
| I | | x |
| V = IR | | F = kx |

Figure 4:
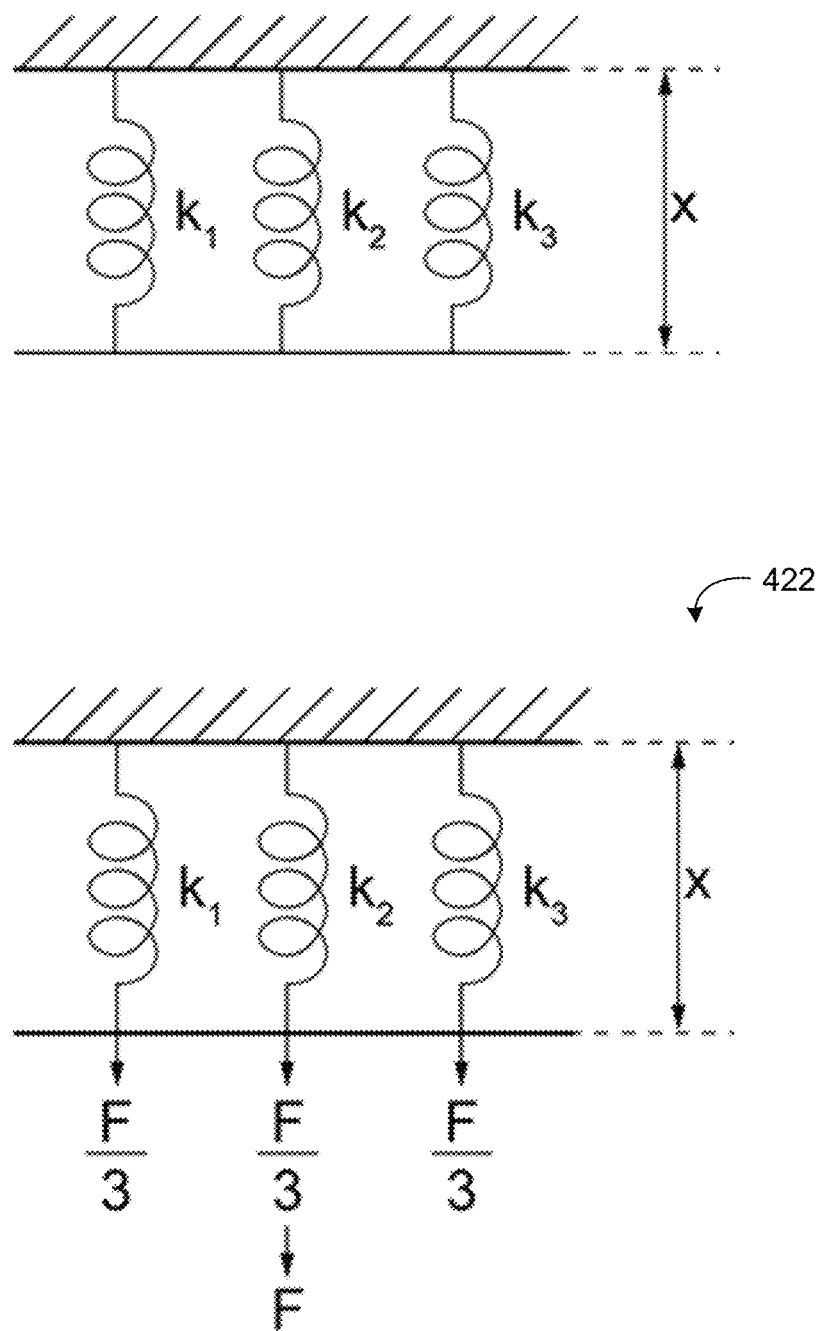
FIG. 4 is a diagram illustrating an example analogy between Hooke's Law and Ohm's law.

FIG. 4 is a diagram illustrating a parallel connection of springs of stiffness $k_1$, $k_2$, $k_3$ across a distance, x. Because x is constant across all three springs, this is analogous to a set of resistors connected in series (not parallel). Because $k=k_1+k_2+k_3$, the forces needed to extend each of the three springs are added together (as shown at 422) to achieve the combined force necessary to extend (or compress) all three springs.

Accordingly, the linear region of Hooke's law is effectively extended. Because of this effect, the quality of the material for the non-electrical MSM battery can be improved without changing the material, if the material itself is also improved, the implication effect can be further increased.

Using packing considerations with normal, state-of-the-art materials, embodiments can be implemented with small dimensions, a large k-value, and a large x-value (i.e., A-value), to increase or maximize the stored energy, $$Ep = \frac{kA^2}{2}.$$

Embodiments can use a plurality of textures arranged in a 'parallel' arrangement (i.e., connected so that the loading force is applied across all of the individual textures) to effectively increase the 'k' value of the system and thus the amount of energy that can be stored. Embodiments may also increase the distance over which the textures can be extended or compressed to increase the Hook's law, and the amount of force, depends on geometry. However, material constants such as Young's modulus (i.e., the elastic modulus of the spring) do not. Embodiments disclosed herein provide a discussion of traditional materials such as steel, for example, or plastic. Young's modulus is the stress over the strain for a material. The stress is the tensile force divided by the cross-sectional area, or F/S. The strain or relative deformation is the change in length, or x divided by the original length, l. Therefore, Young's modulus, H, is $$\frac{F \cdot \ell}{S \cdot x},$$

where S is the area.

The relationship between dimensions of a simple bar of material length, l and the material constant, H, which for a normal Young's modulus, yields a string constant of:

$$k = \frac{H \cdot S}{\ell}. \tag{44}$$

Figure 5:
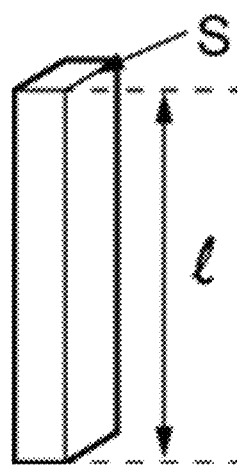
FIG. 5 illustrates an example of Young's modulus in $N/m^2$, where S is the area in $m^2$ and the length, l, is in meters, m.

FIG. 5 is a diagram illustrating an example of these dimensions in SI, where S denotes the cross-sectional area through which the force is applied. In the example of FIG. 5, Young's modulus in N/m², where S is the area in m² and the length, l, in meters, m.

Figure 6:
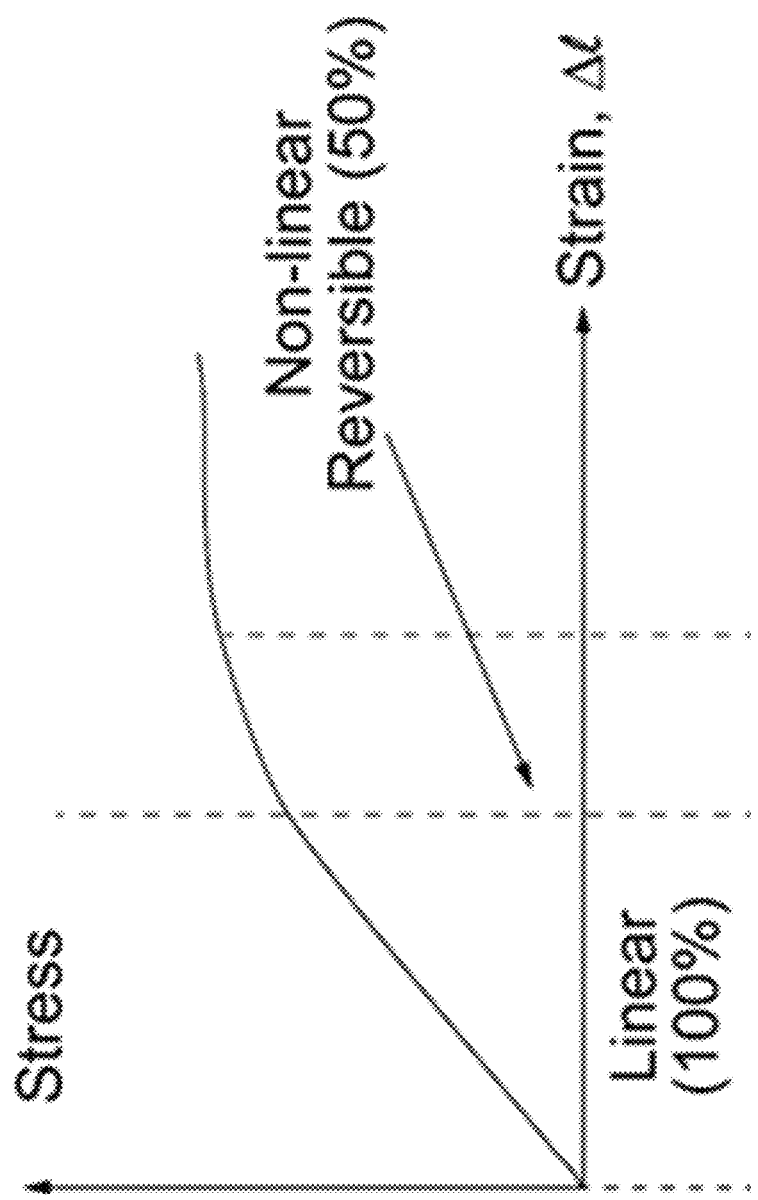
FIG. 6 is a diagram illustrating an example relation between stress, σ, and strain, Δl, for a linear region (100%) and a non-linear reversible (~50%) region.

FIG. 6 illustrates the Relation between stress, σ, and strain, Δl, for an example linear region (100%) and an non-linear reversible (~50%) region. In order to satisfy Hooke's law, the strain, Δl, should be proportional to its length, l:

$$\Delta l \sim l \tag{45}$$

If an additional ~50% of length is added, there is a slight non-linearity and reversibility which can be calculated out, as shown in FIG. 6.

Figure 7:
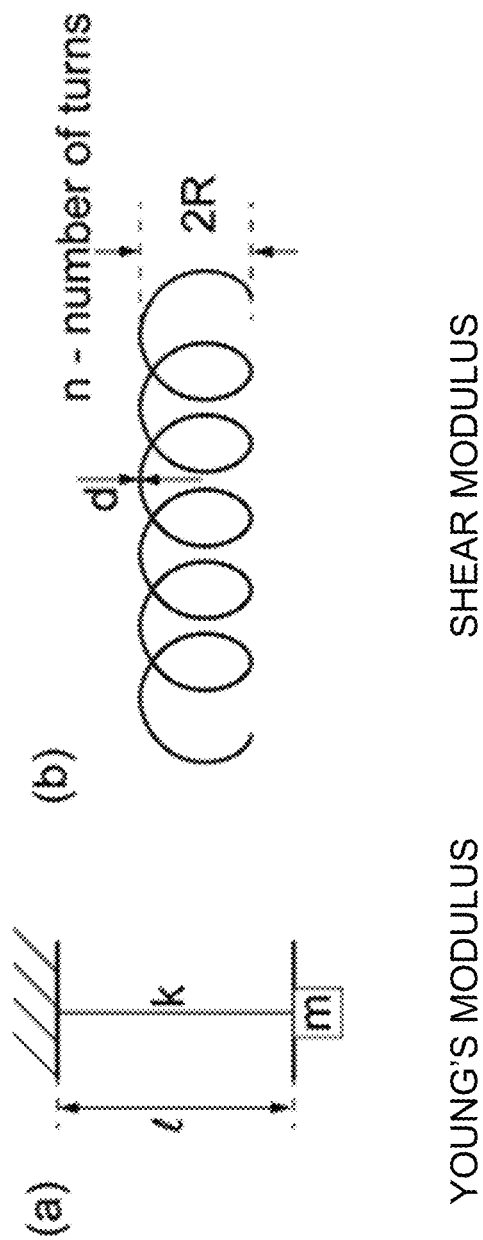
FIG. 7 is a diagram illustrating an example of a normal Young's modulus, H, and a shear modulus, G.

Stiffness is high Young's modulus value. The two stiffnesses are normal stiffness, denoted as H, and shear stiffness, denoted as G. This discussion uses normal stiffness, H, for simplicity. FIG. 7 illustrates (a) a normal Young's modulus stiffness, H, and (b) shear modulus stiffness, or modulus of rigidity, G. Both are a material constant; i.e., they do not depend on geometry.

For a normal Young's modulus, the string constant, k, is a function of the normal Young's modulus, the surface area and the length as follows:

$$k = \frac{H \cdot S}{\ell}, \qquad (46)$$

where k is a string constant, H is the normal Young's modulus, S is area, and l is length. S is used to denote area instead of A, to avoid confusion with amplitude, A, for the shear modulus (FIG. 7 at (b)).

For the shear modulus, G the string constant, k, is the function of the diameter of the material as follows:

$$k = \frac{Gd^4}{64 \, nR^3}, \qquad (47)$$

where G is the shear modulus, or the ratio of shear stress to shear strain, d is the diameter of the material, R is the radius of the coil and n is the number of turns in the coil.

Table 3 illustrates both Young's and shear moduli, and material densities for a number of different sample materials.

TABLE 3

Modulus and Densities

| | Material | Young's Modulus H [N/m²] | Density [g/cm³] | Shear Modulus G [N/m²] |
|---|---|---|---|---|
| 1 | Steel | $2 \cdot 10^{11}$ | 7.8 | $8 \cdot 10^{10}$ |
| 2 | Aluminum | $7.1 \cdot 10^{10}$ | 2.7 | $2.67 \cdot 10^{10}$ |
| 3 | Brass | $10^{11}$ | 8.5 | $3.68 \cdot 10^{10}$ |
| 4 | Copper | $6 \cdot 10^{10}$ | 2.4 | $2.22 \cdot 10^{10}$ |
| 5 | Concrete | $3.8 \cdot 10^{9}$ | 1.3 | ? |
| 6 | Rubber | $2.3 \cdot 10^{9}$ | 1.1 | $8.21 \cdot 10^{8}$ |
| 7 | Plywood | $5.4 \cdot 10^{9}$ | 0.6 | ? |

Other materials that can be used can include rubber or rubberlike materials (butyl rubber, neoprene, isoprene, silicone, polyurethane and other polymers, and other elastomeric materials), Plexiglas®, vinyl, nylon, to name a few. However, these materials have very large expansions ($\Delta l$).

Some specific example calculations are now provided. These calculations are made with the example of FIG. 3, but for simplicity they are made with the normal modulus, H, not the shear modulus, G.

First $H=5 \cdot 10^{11}$ N/m² is rewritten as something between the normal Young's modulus and the shear modulus, but the normal modulus is used for this discussion. Also, this discussion assumes l=10 cm and a linear region of a realistic 10%. Therefore, $\Delta l=1$ cm. However, the linear region will vary by material and material dimensions. Accordingly, the linear region should be determine for the material used and its dimensions. Finally, assume a block of steel, for example, with a volume 10 cm×10 cm×10 cm.

The ratio of the largest normal modulus (normal, steel) to the smallest, which is plywood at $5.4 \cdot 10^9$, is 37. The ratio of respective densities is 13, which will also result in a weight difference of 13-times. Therefore, this will require a 13-times longer length i.e., 130 cm (1.3 m). Take an average modulus of $5 \cdot 10^7$ N/m². Nevertheless, the compensation factor is only 37/13=2.84; i.e., almost complete (close to 1).

Lighter materials such as graphene or carbon strings, for example, might be beneficial, but the weight of steel is only 37-higher than that of rubber. But graphene can be cost prohibitive. Therefore, Example 4 checks steel with an extension from 10 cm to 11 cm (which is, perhaps, destructible).

Example 4. Steel a=100 μm~4 mils, 2a=200 μm~4 mils
H=5·10¹¹ N/m²
l=10 cm, Δl=~0.1l=A=Xmax=1 cm $$S=10 \text{ cm}^2 \qquad (48)$$

The area S, is S=l×l, and the stiffness, k, for the Young's modulus is given by $$k = \frac{H \cdot S}{\ell} \qquad (49)$$

$$S = na^2 \qquad (50)$$

Assuming a realistic area, $S=a^2$ $$n_x = \frac{10 \text{ cm}}{0.4 \text{ mm}} = \frac{10 \text{ cm}}{0.04 \text{ cm}} = 250. \qquad (51)$$

Because the length, l, is 10 cm and the area, S, is 10 cm×10 cm, the volume is $10^3$ cm, and weight is 7.8 g/cm³·10³ cm³=7.8·10³ g=7.8 kg.

The mass of volume 10 cm×10 cm×10 cm, is, in the SI system:

$$m=\rho \cdot V=7.8 \cdot \text{kg} \cdot 10^{-3} \cdot m^{+6}=7.8 \cdot 10^3 \text{ kg} \qquad (52)$$

i.e., a very large weight, which makes this solution questionable.

For comparison, assume an average rubber is used, which is ~1.1 g/cm³=1.1 kg/dcm³.

Consider a global equation on energy:

$$Ep = k\frac{A^2}{2} \qquad (53\,a,b)$$

$$k = \frac{H \cdot S}{\ell}.$$

Then, according to Table 3, for steel ρ=7.8·g/cm³. For a volume of steel of 10 cm×10 cm×10 cm=1 dcm×1 dcm×1 dcm=1 dcm (in CGS units), the result is 7.8 kg/dcm; the same for water: 1 kg/1 dcm.

In contrast, consider a plastic membrane with ρ=1.1 g/cm³, and an area: 100 cm×100 cm; i.e., $S=10^4$ cm² and l=1 cm, the volume is $V=10^4$ cm³, i.e., more than the $10^3$ cm. Now, the mass is $$m=1.1 \text{ g/cm}^3 \, 10^4 \text{ cm}^3=1.1 \cdot 10^4=11 \text{ kg} \qquad (54)$$

i.e., more than for steel: 7.8 kg $\qquad (55)$

Example 5: Plastic Membrane I $$k = \frac{H \cdot S}{l}, \, F = kx - \text{Hooke's law} \qquad (56\,a,b)$$

-continued $$\ell = 1 \text{ cm}, \Delta\ell = 1 \text{ mm } x = 1 \text{ mm} = 10^{-3} \text{ m} \qquad (57)$$

$$H = 2 \cdot 10^7 \text{ N/m}^2 \qquad (58)$$

$$S = 1 \text{ m}^2 \qquad (59)$$

$$k = \frac{2 \cdot 10^7 \text{N/m}^2 \cdot 1 \text{ m}^2}{10^{-3} \text{ m}} = 2 \cdot 10^{10} \text{ N/m} \qquad (60)$$

$$A = x = 10^{-3} \text{ m}, A^2 = 10^{-6} \text{ m}^2 \qquad (61)$$

$$E = k \cdot \frac{A^2}{2} = \frac{2 \cdot 10^{10} \text{N/m} \times 10^{-6} \text{m}^2}{2} = 10^4 \text{ N} \cdot \text{m} \qquad (62)$$

$$E = 10^4 \text{ Wsec} = 2.8 \text{ Wh } \eta = \frac{2.8}{7.8} = 0.34 \text{ Wh/kg} \qquad (63)$$

Example 6: Plastic Membrane II $$\rho=1.1 \text{ g/cm}^3 S=100 \text{ cm} \times 100 \text{ cm} = 10^4 \text{ cm}^2 \qquad (64)$$

$$l=10 \text{ cm}, \Delta l=1 \text{ cm} \qquad (65)$$

$$V=S \cdot l=10^4 \text{ cm}^2 \cdot 10 \text{ cm} = 10^5 \text{ cm}^3 \qquad (66)$$

$$m=\rho \cdot V=1.1 \text{ g/cm}^3 \cdot 10^5 \text{ cm}^3 = 1.1 \times 10^5 \text{ g} = 110 \text{ kg} \qquad (67)$$

Accordingly, this mass for plastic membranes is not suitable for some applications such as robotics, for example, (and materials such as graphene, for example, might be more suitable in such applications). However, plastic membranes may be suitable for some stationary applications where an electric battery cannot be used.

Example 7: Ideal Material

Figure 8:
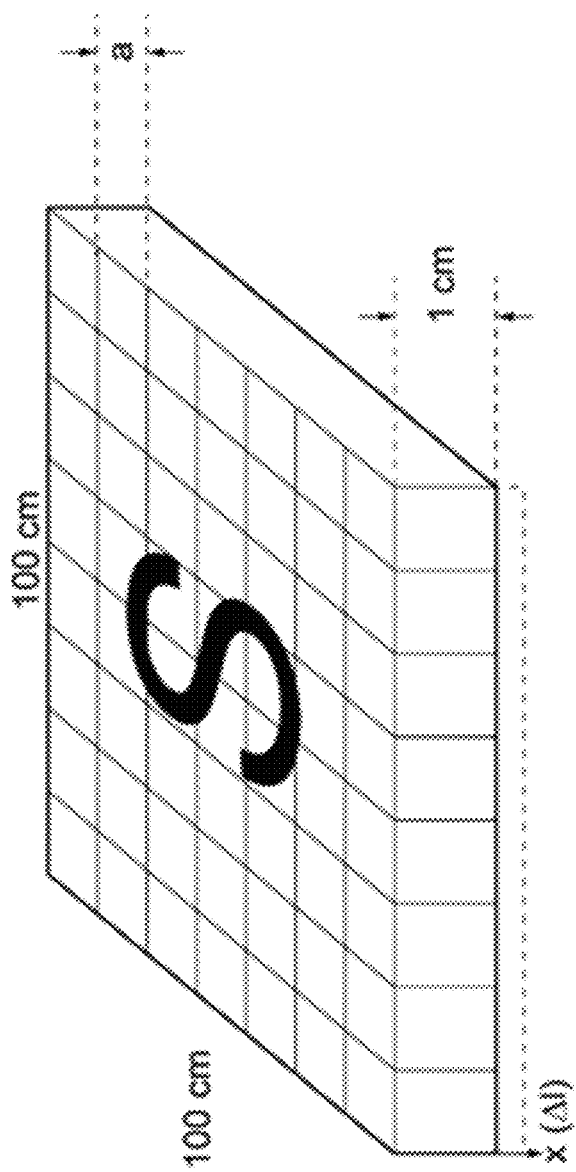
FIG. 8 is a diagram illustrating an example of an ideal geometry for a MSM non-electrical battery material in accordance with one embodiment.

This example considers a more ideal material, such as one having a $\rho=1.1$ g/cm$^3$. The materials should not be lighter than water, and may, for example, be a carbon string, or other heavier material. For this example, consider the geometry as shown in FIG. 8 for the ideal material. Ignoring the issue of folding, and assuming a stiffness slightly better than steel:

$$H = 10^{12} \text{ N/m}^2 \qquad (68)$$

$$2a = 200 \text{ µm} = 0.2 \text{ mm} \qquad (69)$$

$$n_x = \frac{100 \text{ cm}}{200 \text{ µm}} = \frac{200 \text{ cm}}{0.2 \text{ mm}} = \frac{2000 \text{ cm}}{0.2 \text{ mm}} = 10,000 \qquad (70)$$

The area, S, should be the largest because it is in the denominator of k and E. Still, the mass is quite large $$V=1 \text{ m} \times 1 \text{ m} \times 1 \text{ cm} = 10^{-2} \text{ m}^3 \qquad (71)$$

$$m=\rho \cdot V=1.1 \text{ g/cm}^3 \cdot 10^2 \text{ m}^3 = 1.1 \text{ g/cm}^3 \; 10^4 \text{ cm}^{2-}10^4 \; g \cong 10 \text{ kg} \qquad (72)$$

However, this mass is manageable by a robot or other mobile application.

The energy is now computed.

$$k = \frac{H \cdot S}{\ell} = \frac{10^{12} \text{ N/m}^2 \cdot 1 \text{ m}^2}{10^{-2} \text{ m}} 10^{14} \text{ N/m} \qquad (73)$$

$$E = k \frac{A^2}{2} = 10^{14} \text{ N/m } 1 \text{ mm}^2 = 10^{14} \text{ N/m} \cdot 10^{-6} \text{ m}^2 == 10^8 \text{ N} \cdot \text{m} = \qquad (74)$$
$$10^8 \text{ W} = 10^{8J} = 10^8 / 3600 = 27,777$$

$$\eta = E/m = 27,777/10 = 2777 \text{ Wh/kg} \qquad (75)$$

Graphene density is relatively low at about 2 g/cm$^3$, but graphene is extremely expensive. Also, graphene has the stiffness of steel (~3·10$^{11}$ N/m$^2$).

Figure 9:
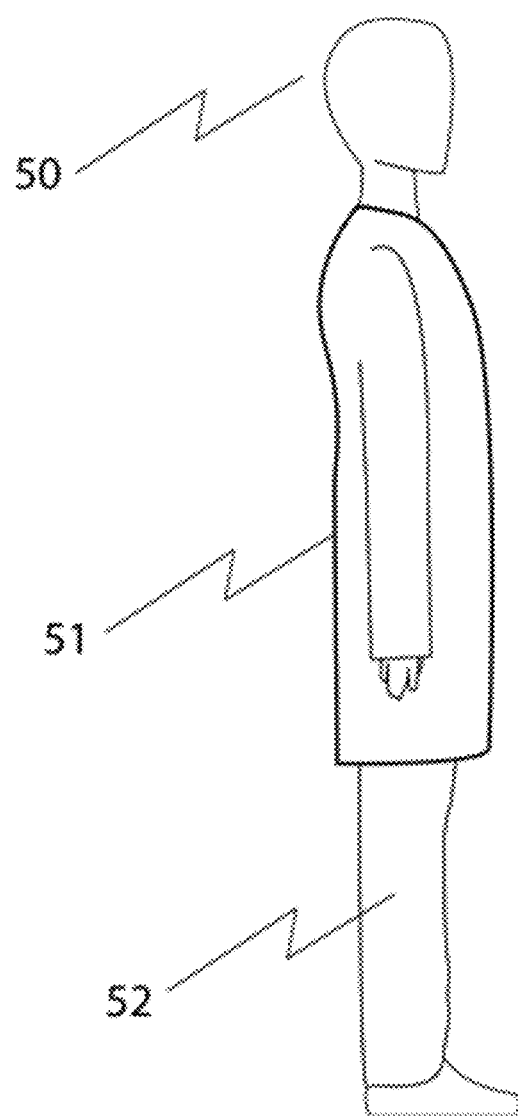
FIG. 9 is a diagram illustrating an example of a robot with a non-electrical battery in the form of a coat in accordance with one embodiment.

In various embodiments, the nonelectric battery technology disclosed herein can be used to power a number of devices. One such device is a manned or unmanned vehicle. As a further example, the vehicle can be a robotic vehicle or even a robot. Examples are described herein in terms of a robot as an example application for the disclosed battery technology, however after reading this description one of ordinary skill will understand how the battery technology disclosed herein can be used in other vehicles and in other applications in general. FIG. 9 is a diagram illustrating an example of a robot 50 in the shape of a human being 52. This example includes a non-electrical battery 51 in the form of one or more membranes sewn into the shape of a coat, or one or more membranes forming a panel of the coat. The non-electrical battery 51, for example, can have a size of 1 m×1 m×1 cm, although other sizes are possible. As a further example, the non-electrical battery can have a length in the range of 0.2 m to 2 m, or larger; and a width also in the range of 0.2 m to 2 m, or larger and thicknesses of 1-2 cm or less. For example, for MEMS structures, thicknesses of the non-electrical battery can be 1 mm.

Tethered unmanned vehicles are known in the state of the art, such as the Multi-Utility Tactical Transport, which is used to help dismounted infantry units in the field. Tethered unmanned ground vehicles have been in use for decades, such as those used by Germans during World War II in Poland during the Warsaw Uprising in 1944. Embodiments of the non-electrical battery can be implemented to enable untethered unmanned vehicles due to the mechanical (non-electric) energy that can be restored and released as needed.

Figure 10:
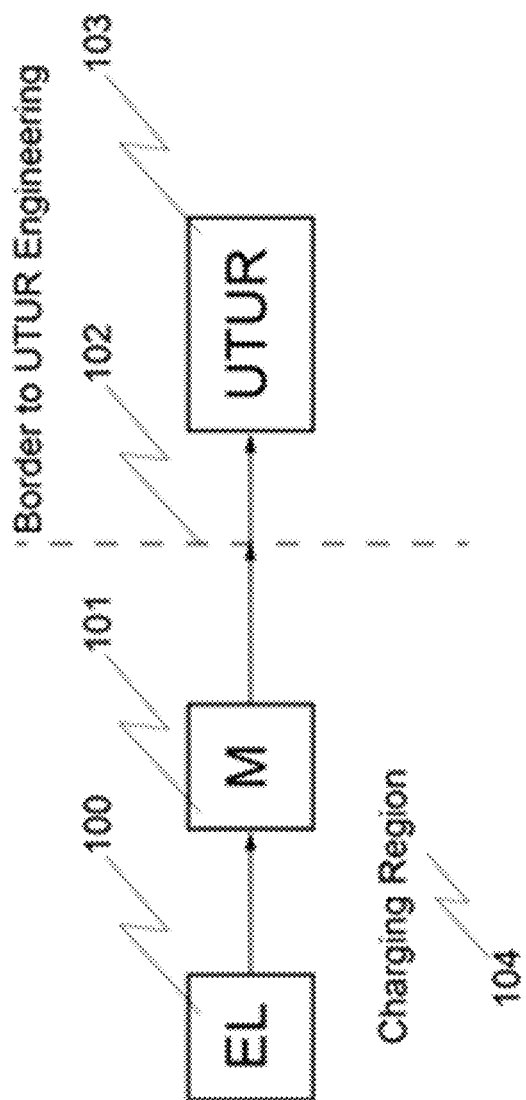
FIG. 10 is a diagram illustrating an example of a transfer from a charging region to UTUR engineering in accordance with one embodiment.

In various embodiments, electrical or mechanical energy is converted into a particular type of mechanical energy, referred to as string energy. This conversion can take place, for example, using a windlass, tackle block or other energy transfer device. FIG. 10 is a diagram illustrating an example of the transfer from a charging region to an untethered, unmanned vehicle such as, for example, and untethered unmanned robot. With reference now to FIG. 10, in various embodiments electrical energy 100 is transferred or converted into mechanical energy 101 in a charging region 104 of the system. As noted above, a windlass or other like device can be powered by electrical energy (such as, for example, through an electric motor) to create the desired mechanical energy 101, which is transferred from charging region 104 to the untethered unmanned robot 103 at the border 102.

Another example of a robotic or robot-like device is the powered exoskeleton. Engineers of powered exoskeletons face a number of challenges to build a powered exoskeleton that is capable of meeting the desired performance requirements yet still has a sufficient power supply to sustain prolonged operations.

Figure 11:
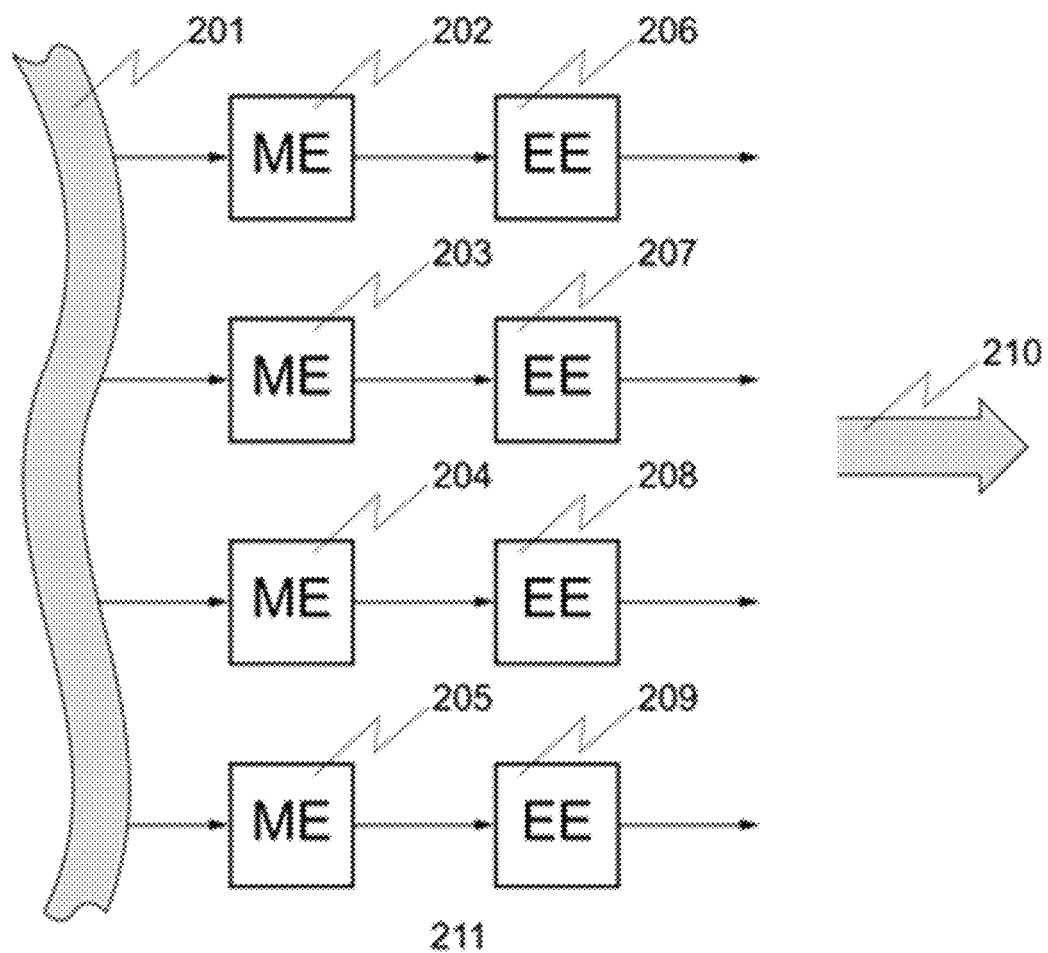
FIG. 11 is a diagram illustrating an example of an interior UTUR view in accordance with one embodiment.

FIG. 11 provides an example of applying exoskeleton engineering 211 based on electrical energy. This example includes a membrane 201 and a plurality of mechanical energy (ME) modules 202, 203, 204, and 205 connected to the non-electrical battery supplied in the form of membrane 201. Mechanical energy (ME) modules 202, 203, 204, and 205 are in turn connected to a plurality of respective electrical energy modules (EE): 206, 207, 208, and 209.

In operation, membrane 201 provides stored mechanical energy to mechanical energy (ME) modules 202, 203, 204, and 205, which convert the stored mechanical energy to electrical energy and provide the electrical energy to the respective electrical energy modules (EE): 206, 207, 208, and 209. In other embodiments, mechanical energy modules can be configured to directly operate the device being powered. For example, mechanical energy modules can be used to operate hydraulic actuators, pneumatic actuators, air pumps, and so on.

Now described is a comparison of electrical energy and non-electric (mechanical) energy batteries, based on available experimental battery data.

Supportive Mass

Total battery mass is:

$$m(1+\alpha) \tag{76}$$

where m is the effective mass that contributes to energy production, and ma is the supportive mass of the structure.

In the case of an electric battery, the supportive mass fraction coefficient, $\alpha$, should be large (such as, for example, $\alpha=0.3$, or higher), because the battery structure for an electric battery must be strong enough to protect the toxic battery materials from escaping into the environment. Therefore, electric batteries often have heavy metals such as solid iron (~7 g/cm$^3$), solid magnesium (~3 g/cm$^3$), lead (~8 g/cm$^3$), etc. On the other hand, in the case of non-electrical batteries, toxic materials can be avoided, so, light metals or other light materials may be used for mechanical support, in small parts, such as aluminum (~3 g/cm$^3$), titanium (~4 g/cm$^3$), etc. Therefore, the $\alpha$-coefficient for a non-electrical battery is small (e.g. on the order of about 5%), especially when composite materials are used.

Assume that the efficiency of the electrical battery is:

$$\eta_e = 100 \text{ Wh/kg} \tag{77}$$

Generally, only a small part of the mass: m (1+$\alpha$), namely, m, of the electrical battery participates in the production of energy, and the rest is for structural support and environmental protection. While 100 Wh/kg is good baseline for electrical energy efficiency, even 550 Wh/kg-values can be achieved in extreme conditions, however.

Battery Efficiency

In addition to Young's modulus and material density, a new parameter may be considered in the case of the non-electrical battery, which is elasticity. The inventors have defined a new, previously unrecognized parameter, elasticity, $\varepsilon$, which is a fraction of the original length, l, in which the string extension is reversible (this is broader than linear part). Thus, the maximum time reversible extension of a material, A, is given in terms of this new parameter as:

$$A = \varepsilon \cdot l \tag{78}$$

Hooke's law constant, k, is in the form:

$$k = \frac{H \cdot S}{\ell} \tag{79}$$

where H is Young's modulus, and S is the surface area of the membrane. The effective mass, m, is equal to:

$$m = \rho \cdot S \cdot l \tag{80}$$

Where $\rho$ is material density in g/cm$^3$.

Therefore, this yields the following new equations:

$$E = \frac{kA^2}{2} = \frac{k\varepsilon^2 \ell^2}{2} \tag{81}$$

$$k = \frac{H \cdot S}{\ell} \tag{82}$$

Thus, the energy efficiency, $\eta$, is $$\eta = \frac{\frac{\varepsilon^2 \ell^2}{2} \frac{H \cdot S}{\ell}}{\frac{\rho S \cdot \ell}{1}} = \frac{\varepsilon^2 H}{2} \frac{1}{\rho} = \frac{\varepsilon^2 H}{2\rho} \tag{83}$$

This shows that only three (3) constants are included, while variables are used to determine the efficiency. For plastic (nylon), improvement of Young's modulus can be achieved by also including, for example, some steel elements, graphene, butyl rubber, neoprene, polyurethane, plexiglass, vinyl, nylon, etc. However, a low material density can still be achieved, which is close to:

$$\rho = 1.1 \text{ g/cm}^3 \tag{84}$$

For hardened plastic, assume a higher Young's modulus:

$$H = 10^{10} \text{ N/m}^2 \tag{85}$$

Also, for weight limitations, assume:

$$m = 10 \text{ kg} \tag{86}$$

However, now, free (supportive) weight can also be considered, which is also element of some embodiments:

$$m = \rho \cdot V = 1.1 \text{ g/cm}^3 \cdot 10^4 \text{ cm}^2 \cdot 1 \text{ cm} = 1.1 \text{ g/cm}^3 \cdot 10^4 \text{ cm}^3 = 11 \text{ kg} \tag{87}$$

This 11 kg of effective mass produces the following string energy (energy dissipation is ignored):

$$E = k\frac{A^2}{2} = \frac{H \cdot S}{2\ell} A^2 = \tag{88}$$

$$\frac{HS}{2\ell}\ell^2 \cdot \varepsilon^2 = \frac{H \cdot S \cdot \ell \cdot \varepsilon^2}{2} = \frac{10^{10} \text{ N/m}^2 \cdot 1 \text{ m}^2 \cdot 0.16}{2} \times 10^{-2} \text{ m} =$$

$$10^{10} \text{ N/m}^2 \cdot 1 \text{ m}^2 \cdot 10^{-2} \text{ m} \cdot 0.08 = 10^8 \text{ N} \cdot \text{m} \ (0.08) =$$

$$8 \cdot 10^6 \text{ N} \cdot \text{m} = 8 \cdot 10^6 \text{ Wsec} = 2222 \text{ Wh}$$

However, in applications with a design constraint of only: m (1+$\alpha$)=10 kg, with $\alpha$=5%, the effective mass, m, is $$m = \frac{10 \text{ kg}}{1+\alpha} = \frac{10 \text{ kg}}{1.05} = 9.52 \text{ kg} \tag{89}$$

While 2222 Wh is produced by 11 kg, the application requires energy produced by 9.52 kg. Thus, the mechanical energy, is $$E_m = 2222 \text{ Wh} \times \frac{9.52 \text{ kg}}{11 \text{ kg}} = 1923 \text{ Wh} \tag{90}$$

using 20 Wh-unit (e.g., obtained from the example of long stairs; see FIG. 2) yields $$E_m = \frac{1923}{20} = 96 \text{ units} \tag{91}$$

which is a substantial amount of mechanical energy to power a device such as a UTUR, for a single mission.

Comparison of Electrical and Non-Electrical Energy Efficiencies

For comparison of string (mechanical) energy efficiency with that of electrical energy, the same criteria are used for both cases. For non-electrical energy, with limitation of 10 kg as total mass, the supportive masses for both cases can be eliminated for comparison purposes. For the non-electric battery, Eq. (90) shows the mechanical energy for the non-electric battery, which produces 1923 Wh from 9.52 kg of effective mass. For the electric battery, and a supportive mass coefficient of 30%, with total mass of 10 kg, the effective mass is:

$$m = \frac{10 \text{ kg}}{1 + 0.3} = \frac{10 \text{ kg}}{1.3} = 7.7 \text{ kg} \tag{92}$$

For the electric battery, the above assumes: 100 Wh/kg. So, from an effective mass of 7.7 kg (for 10 kg-total), the energy is:

$$7.7 \text{ kg} \times \frac{100 \text{ Wh}}{\text{kg}} = 770 \text{ Wh} \tag{93}$$

Thus, comparing Eq. (90), with Eq. (93) provides a ratio of mechanical energy to electrical energy for the two batteries:

$$\frac{E_m}{E_e} = \frac{1923 \text{ Wh}}{770 \text{ Wh}} = 2.5 \tag{94}$$

Accordingly, in this example, mechanical energy is 2.5-times more efficient than electrical energy.

Absolute Non-Electric Battery Efficiency

Non-Electric Battery (NEB) absolute efficiency, $\eta_{NEB}$, is now described. This efficiency is defined in absolute terms, independent of the electric battery efficiency. In such a case, Eq. (A1-108), can be provided in the form:

$$\eta = \frac{H\varepsilon^2}{2\rho} \tag{95}$$

A check of the units reveals that $\varepsilon$ is dimensionless coefficient, thus, what remains, is:

$$[\eta] = \frac{\text{N} \cdot m}{\text{kg}} = \left[\frac{\text{N}}{m^2} \frac{m^3}{\text{kg}}\right] = \frac{\text{N} \cdot m}{\text{kg}} \tag{96}$$

This is the correct result, because:

$$N \cdot m = N \cdot (m/\text{sec})\text{sec} = W \cdot \text{sec} \tag{97}$$

Next, calculating the efficiency for $H=10^{10}$ N/m², and $\rho=1.1$ g/cm³. In MKSA, yields:

$$H = 10^{10} \text{ N/m}^2, \rho = \frac{1.1 \text{ g}}{\text{cm}^3} = \frac{1.1 \cdot 10^{-3} \text{ kg}}{10^{-6} \text{ m}^3} = 1.1 \cdot \left(\frac{10^3 \text{ kg}}{\text{m}^3}\right) \tag{98}$$

Also assuming that $\varepsilon=0.4$; thus, $\varepsilon^2=0.16$, and $$\eta = \frac{10^{10} \cdot (0.16)}{2 \cdot 1.1 \cdot 10^3} = 0.073 \cdot 10^7 \text{ N} \cdot m/\text{kg} = 7.3 \cdot 10^5 \text{ N} \cdot m/\text{kg} \tag{99}$$

However, $$\eta = 7.3 \cdot 10^5 \text{ Nm/kg} = 202.8 \text{ Wh/kg} \tag{100}$$

This is, because, 1 h=3600 sec. However, in a more accurate real-life comparison with the electrical battery, the supportive mass should be included. This is included by the coefficient, $\alpha$. Thus, instead of Eq. (A1-120), the efficiency can be written as:

$$\boxed{\eta_{NEB} = \frac{H\varepsilon^2}{2\rho(1+\alpha)}} \tag{101}$$

where, it was assumed above that $\alpha=5\%$. Thus, $$\eta_{NEB} = \frac{202.8}{1.05} = 193 \text{ Wh/kg} \tag{102}$$

Table 4 compares $\eta_{NEB}$, for four important H-values.

TABLE 4

Non-electric Battery Efficiency, $\eta_{NEB}$ for Young's Modulus, H, for NEB String (membrane) Material (kind of plastic)

| H-Value | $\eta_{NEB}$-Value |
|---|---|
| $2.3 \cdot 10^9$ N/m² | 44 Wh/kg |
| $2.5 \cdot 10^9$ N/m² | 48 Wh/kg |
| $5 \cdot 10^9$ N/m² | 96.5 Wh/kg |
| $10^{10}$ N/m² | 193 Wh/kg |

Analytic Method of String/Membrane Battery Design for Maximizing Efficiency

Perhaps string/membrane non-electric battery is the only device that can be generally designed by applying analytic methods even if material engineering is involved. This is because of Eq. (A1-126), which in purely material form, is $$\eta_{NEB}^{(H)} = \frac{H\varepsilon^2}{2\rho} = f(H, \rho, \varepsilon) \tag{103}$$

which defines 4D space:

$$\eta_{NEB}^{(M)} = \eta_{NEB}^{(M)}(H, \rho, \varepsilon) \tag{104}$$

Due to the analytic formula (A1-128) we differential calculus can be applied, in the form:

$$\frac{\Delta \eta_{NEB}^{(M)}}{\eta_{NEB}^{(H)}} = \frac{\Delta H}{H} + \frac{2\Delta \varepsilon}{\varepsilon} - \frac{\Delta \rho}{\rho} \quad (105)$$

Eq. (A1-130) allows designing a proper path to maximize the material energy efficiency $\eta_{NEB}^{(M)}$ of the battery.

Example 8. Right Choice of Material Research

Assume a given plastic material with $\rho=1.1$ g/cm$^3$, and $H=2.3 \cdot 10^9$ N/m$^2$, with $\varepsilon=0.3$. Further assume a goal of increasing its string membrane non-electrical energy efficiency, by increasing elasticity from $\varepsilon=0.3$ to $\varepsilon=0.4$, which might be done, for example at the expense of increasing its material density to $\rho=1.3$ g/cm$^3$ (by using heavier metallic elements), while its Young's modulus, should increase from $2.3 \cdot 10^9$ N/m$^2$ to $2.5 \cdot 10^9$ N/m$^2$. Is this an effective way to do it?

Answer:

$$\eta_{NEB}^{(M)} = \frac{2.3 \cdot 10^9 \text{N/m}^2 (0.3)^2}{2 \cdot 1.1 \text{ g/cm}^3} = \frac{2.3 \cdot 10^9 \text{N/m}^2 (0.3)^2}{2 \times 1.1 \text{ kg}^{-3}/\text{m}^{-6}} = \quad (106)$$

$$\frac{2.3 \cdot 10^9 (0.09)}{2.1(1.1) \cdot 10^3} = \frac{2.3 \cdot 10^6 (0.09)}{2.1(1.1)} = 0.085 \cdot 10^6 =$$

$$8.5 \cdot 10^4 \text{ N} \cdot \text{m/kg} = 85000 \text{ Nm/kg} = 23.6 \text{ Wh/kg}$$

$$\frac{\Delta H}{H} = \frac{1.2 \cdot 10^9}{2.3 \cdot 10^9} = 0.52 \quad (107a)$$

$$\frac{\Delta \rho}{\rho} = \frac{1.3 - 1.1}{1.1} = \frac{0.2}{1.1} = 0.18 \Rightarrow \frac{\Delta \rho}{\rho} = -0.18 \quad (107b)$$

$$\frac{\Delta \varepsilon}{\varepsilon} = \frac{0.1}{0.3} = 0.38 \quad (107c)$$

$$\frac{\Delta H}{H} - \frac{\Delta \rho}{\rho} + \frac{2\Delta \varepsilon}{\varepsilon} = 0.52 - 0.18 + 0.66 = 1 > 0. \quad (108)$$

Thus, $\eta_{NEB}^{(M)}=23.6$ Wh/kg, and the new efficiency, $\eta$, is $$[\eta_{NEB}^{(M)}]_{NEW} = 47.2 \text{ Wh/kg}. \quad (109)$$

Accordingly, material efficiency increased by a factor of two in spite of the increase in the material's density by 18%.

Example 9. Anti-Countermeasure

In various applications in active conditions it may be desirable for robots to avoid unwanted resonances. This can be done, for example, by increasing the resonant frequency, and increasing the structural stability of the membrane structure. Also, in accordance with Eq. (43) both the string constant of Hooke's law, k, and mass, m, are superpositions of many MEMs cells.

Assume again that each cell has length of about 1 cm, and only the surface is variable. In Table 1, they have size of 1 mil×1 mil (25.4×25.4 μm). Thus, the resonant frequency, $\omega_o$, is $$\omega_o = \sqrt{\frac{k}{m}}, \quad (110)$$

where, $S_o=25.4$ μm×25.4 μm, l=1 cm, and, assuming $H=2.3 \cdot 10^9$ N/m$^2$, m=1.1 g/cm$^3$. Checking the units provides correct results:

$$[\omega_o] = \sec^{-1} \quad (111)$$

and, $$f_o = \frac{\omega_o}{2\pi} = \frac{1.41 \cdot 10^5}{2\pi} = 2.2 \cdot 10^4 \text{ Hz}. \quad (112)$$

In other words, $f_o=22$ kHz and sufficient to be protective against usually lower unwanted frequencies (for example, including noise-induced vibrations). Eq. (76) also includes systemic coefficient α, also included in Eq. (101) which should also be considered in differential formula (105), which is also an embodiment of the invention.

Figure 12:
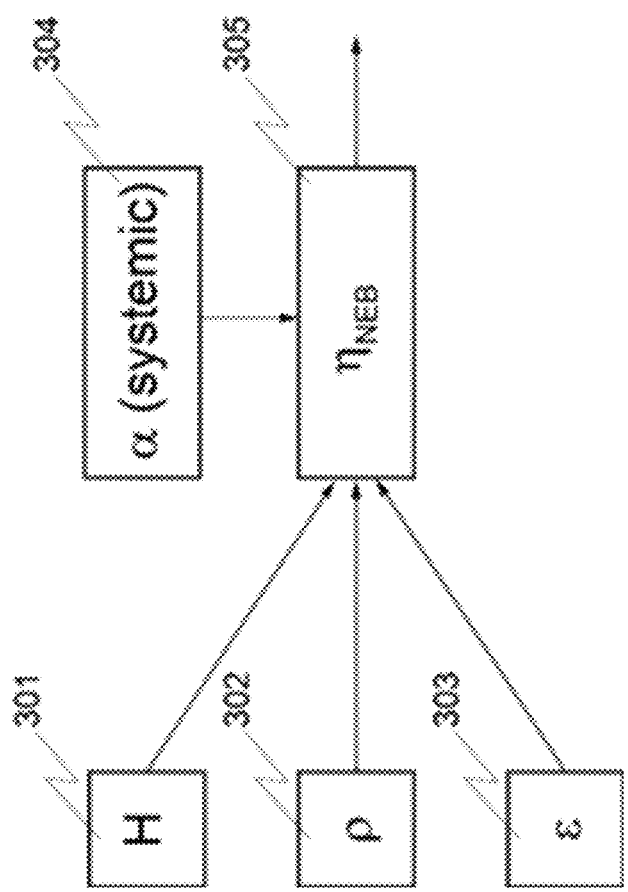
FIG. 12 is a diagram illustrating an example of an analytic formula with the addition of a systemic coefficient to maximize energy efficiency in accordance with one embodiment.

FIG. 12 illustrates an analytic formula of Eq. (106), with the addition of systemic coefficient α to improve or maximize energy efficiency $\eta_{NEB}$. The example of FIG. 12 includes four design components: H, ρ, ε, α. Design component, H, is a string material component, 301. Design component, ρ, is string material component, 302. Design component, ε, is string material component, 303. Design component, α, is systemic component, 304. These components contribute to maximizing efficiency $\eta_{NEB}$, 305, through an analytic method, and differential formula of Eq. (105) which is novel.

Example 10. False Positives and Frequency Stability Method

The natural resonant frequency can be defined by:

$$\omega_o = \sqrt{\frac{k}{m}} \; ; \quad f_o = \frac{\omega_o}{2\pi} \quad (113a, b)$$

Where $\omega_o$ is angular frequency, and $f_o$ is frequency in Hz.
Using non-electric battery membrane formulas:

$$k = \frac{H \cdot S}{\ell}, \quad m = \rho \cdot \ell \cdot S \quad (114a, b)$$

which yields $$\frac{k}{m} = \frac{\frac{H \cdot S}{\ell}}{\frac{\rho \cdot \ell \cdot S}{1}} = \frac{H \cdot S}{\ell} \cdot \frac{1}{\rho \cdot \ell \cdot S} = \frac{H}{\rho \ell^2} \quad (115)$$

Accordingly, the compact formula for frequency of the non-electrical battery:

$$\omega_o^2 = \frac{H}{\rho \cdot \ell} \quad (116)$$

This is important because vibrations of the application can provide difficulty for the mechanical battery. Consider an example using the data for plastic as the material:

$$\rho = 1.1 \cdot 10^3 \text{ kg/m}^3 = 1.1 \text{ g/cm}^3 \quad (117)$$

$$H = 2.3 \cdot 10^8 \text{ N/m}^2 \quad (118)$$

Thus, $$\omega_o^2 = \frac{2.3 \cdot 10^9 \text{ N/m}^2}{1.1 \cdot 10^3 \text{ kg/m}^3} \frac{1}{10^{-4} \text{m}^2} = 2.1 \cdot 10^{10} \frac{\text{N}}{\text{kg}} \frac{1}{m} \quad (119)$$

The formula can be checked for correctness by checking the units:

$$\omega_o^2 = \frac{1 \text{ N/m}^2}{\text{kg/m}^3 \cdot \text{m}^2} = \frac{1 \text{ N}}{\text{kg} \cdot \text{m}} = \frac{1}{\text{sec}^2} \frac{m}{m} = \frac{1}{\text{sec}^2} \quad (120)$$

i.e., $$\omega_o = \frac{1}{\text{sec}} \quad (121)$$

which is correct.
From Eq. (121):

$$\omega_o = 1.45 \cdot 10^5 \text{ rd/sec} = > f_o = \quad (122)$$

$$\frac{\omega_o}{2\pi} = 0.23 \cdot 10^5 \text{ rd/sec} = 2.3 \cdot 10^4 \text{ Hz} = 23 \text{ kHz}$$

Which is a high MEMS frequency.

One example frequency stability method is now described. This illustrates that membranes may be configured as MEMS structures to provide stability against the typical unwanted lower frequencies, which is similar to natural biologic ("human") structures which are highly tolerant to rough terrain (reducing false positives rate).

FIG. 13 illustrates low-frequency tolerance by comparing natural, MEMS, and biologic structures in the context of natural resonant frequencies. Thus, a typical robot (or other structure) based on MEMS non-electric batteries will be more stable in response to typical frequencies. In contrast, natural vehicles are not stable to such natural frequencies and typically require frequency vibration suppressors.

In FIG. 13, numbers are provided for a plastic material, for simplicity. Also Equation (116) does not contain "hidden" S-parameters. Therefore, the chart 400 of FIG. 13 also demonstrates adequate S-area parameters, typically in mils, in order to minimize value of the l-parameter. In fact, in natural vehicles 401, their length can be larger (e.g., 5 m or greater in trucks) so frequencies will be even lower. Therefore, in MEMS robots, elementary strings should have MEMS sizes dimensioned to maximize natural resonant frequencies in order to be far apart from typical rough terrain and countermeasure noise, which is expected to be much lower. For comparison, biologic structures 403 are also included in FIG. 13. The example biologic structures 403 include bacteria, viruses, parasites, etc., which are natural components of human body together with human cells and tissues. Of course, such elements have lower "strength", or Young's modulus when compared to the plastic material, which leads to lower resonance frequencies. In general, embodiments emphasize a good selection of MEMS technology as string elements of robotic membranes. Thus, such robots will have high frequency stability and low noise, which could be expressed in lower positives in the process of target recognition.

Thus, some embodiments of the technology disclosed herein apply high resonant frequency structures (such as those generated by MEMS technology) in order to maximize structural stability of robotic and other like devices and to minimize false positives in target recognition process. In FIG. 13, the review of resonance frequencies is presented in the form of chart 400, including three areas of interest, for comparison, such as the area of terrain vehicles 401 and the area of biologic structures 403 to emphasize the advantages of MEMS devices 402 based on non-electric batteries.

It is also noted that MEMS structures can be even nano, or rather submicron size structures.

Example 11. Method of Systemic Factor-α to Maximize Energy Efficiency

This example presents a method of systemic factor-α, to maximize energy efficiency of structures based on non-electric batteries. The transfer of non-electric battery energy into direct-mechanical energy, or transient-electrical energy requires heavy metal elements in order to keep the battery in mechanical balance. However, total non-electric battery mass is composed of two parts:

$$m(1+\alpha) = m + m\alpha \quad (123)$$

where m is the effective mass of the battery producing string energy, while mα is supportive mass for the above energy transfers. Thus, energy efficiency, $\eta_{NEB}$ must be reduced, according to the following formula:

$$\eta_{NEB} \to \frac{\eta_{NEB}}{1+\alpha} \quad (124)$$

This formula presents the innovation which states that we need to minimize the α-systemic factor, in order to maximize final non-electric battery energy.

Example 12. Shear Modules and Their Derivatives for Energy Efficiency Optimization and Compactness of the System This example addresses a MSM system based on shear strings and membranes rather than on a linear member. The difference is shown in FIG. 7. Thus this example discusses FIG. 7, part (b). In this case:

$$k_2 = \frac{Gd^4}{64 \, nR^3} \quad (125)$$

where $k_2$ is Hooke's law constant for the shear modulus, G is its Young's modulus coefficient for the shear case, n is the number of turns, R is the radius, and d is string diameter as shown in FIG. 7, part (b). This is reproduced as FIG. 14.

Figure 14:
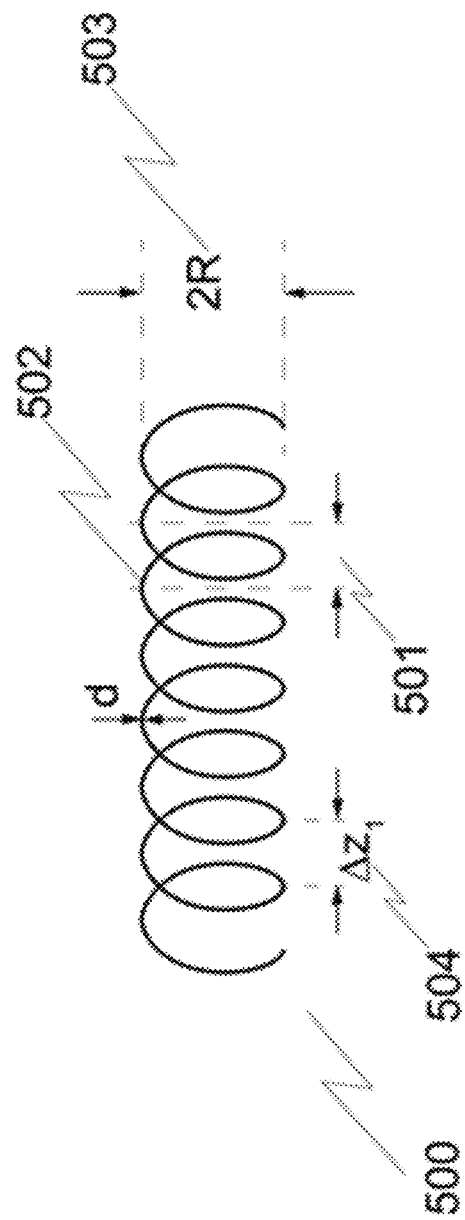
FIG. 14 is a diagram illustrating an example of a shear module in accordance with one embodiment.

In FIG. 14, an example of Shear modulus is presented. This example shows components of Eq. (125), including one turn 501 of the string, the string's diameter 502 (represented by d in Eq. (125)) and radius 503 of the winding 500 (represented by R in Eq. (125)). In FIG. 14, the module is shown in an extended position by 504, or $\Delta z_1$, which is separately shown in FIG. 15.

Figure 15:
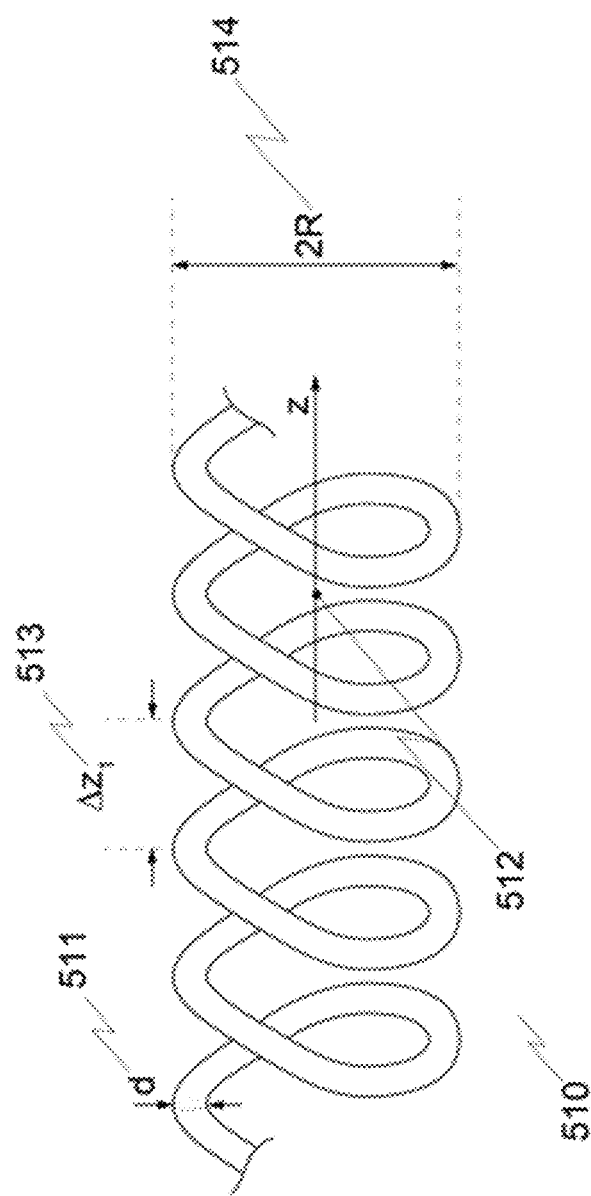
FIG. 15 is a diagram illustrating an example of an extension of a shear module in accordance with one embodiment.

FIG. 15 illustrates an example of a module extension 510. Particularly, this figure illustrates an extension of several turns of a module in which the diameter, d 511, of the string is the z-axis 512 of extension.

One turn extension is denoted by $\Delta z_1$ 513, 514 is the radius, R, of the module 500. At the rest state (no extension), length, l, of the textural element is:

$$l = nd \quad (126)$$

However, the total extension, $\Delta z$, of the module 500 is $$\Delta z = n \Delta z_1 \quad (127)$$

where $\Delta z_1$ is shown in FIG. 14, and n is number of turns. The ratio of $\Delta z$ to l is denoted by coefficient $\varepsilon$:

$$\Delta z = \varepsilon \cdot l \quad (128)$$

Comparing Eqs. (126) and (127) shows that:

$$\Delta z_1 = \varepsilon \cdot d \quad (129)$$

It is seen that it can be:

$$\varepsilon > 1 \quad (130)$$

in contrast to linear case, when $$\varepsilon < 1 \quad (131)$$

Also the total length of string, L, is:

$$L = 2\pi R n \quad (132)$$

Using a reference equation for a linear string, which can be written as:

$$k_1 = \frac{G \cdot S}{\ell} \quad (133)$$

In order to simplify the equation for the shear modulus, replace variables with constants as in the case of the linear modulus. Accordingly, constant, x, can be introduced in the form:

$$R = d^x \quad (134)$$

Thus, Equation (125) becomes $$k_2 = \frac{Gd^4}{64\, nR^3} = \frac{Gd}{64\, nx^3} \quad (135)$$

This yields a simple formula for energy, which is $$E_2 = \frac{k_2 (\Delta z)^2}{2} \quad (136)$$

Thus, energy, $E_2$, is $$E_2 = \frac{k_2(\Delta z)^2}{2} = \frac{Gd^4}{64\, R^3 \cdot 2} \cdot \frac{\varepsilon^2 l^2}{n} = \frac{Gd^4}{128\, nR^3} \varepsilon^2 n^2 d^2 = \frac{Gd^6 \varepsilon^2 n}{128\, R^3} \quad (137)$$

where Eq. (130) has been used.
Now, the mass of string, is $$m_2 = \rho 2\pi R \frac{\pi d^2}{4} n \quad (138)$$

or, $$m_2 = \rho \frac{\pi^2 R d^2 n}{2} \quad (139)$$

Now, using Eq. (134), the following formula for energy efficiency is derived:

$$\eta_2 = \frac{E_2}{m_2} = \frac{Gd^6 \varepsilon^2 n}{128\, R^3} \frac{2}{\rho \pi^2 n R d^2} \quad (140)$$

thus, $$\eta_2 = \frac{Gd^4 \varepsilon^2}{64\, R^4 \pi^2 \rho} = \frac{G\varepsilon^2}{64\, x^4 \pi^2 \rho} \quad (141)$$

Equation (141) is similar to that in the linear case, except there is one additional constant, x:

$$\eta_2 = \frac{G\varepsilon^2}{64\, x^4 \pi^2 \rho} \quad (142)$$

This provides a mixed result. The good news is that $\varepsilon$ can be even larger than 1, rather than 0.4 as it is in the linear case. However, the "bad news" is threefold: there is a smaller Young's modulus, there is an extra factor (64) in the denominator, and a new constant x, which must be larger than 1 in order to avoid friction during module extension, is introduced.

Therefore, this is expected to yield low energy efficiency, especially in the case of a nominal value of $G = 8.21 \cdot 10^8$ N/m$^2$. Assume high $\varepsilon$ value, e.g., $\varepsilon = 5$. Then the formula for energy efficiency can be determined with $x = 1.5$:

$$\eta_2 = \frac{8.21 \cdot 18^8 \cdot 25}{64 \cdot 5.1 \cdot 9.87 \cdot 1.1 \cdot 10^3} = \quad (143)$$
$$0.058 \cdot 10^5 \text{ N} \cdot \text{m/kg} = 5.8 \cdot 10^3 \text{ N} \cdot \text{m/kg} = 1.6 \text{ Wh/kg}$$

(using: 1 N·m = 1 W·sec)

Following the linear case, a situation when the shear module's Young's modulus constant increases the same number of times; i.e., 4.34-times, to obtain the energy efficiency of: 1.61×4.34=7 wh/kg, which is still a small value.

Example 13. Compactness of the System

Embodiments can be implemented to provide a size advantage, and in some cases a significant compactness advantage as compared to a simple (linear) system. To find some quantitative relations it is useful to note that, at rest, the thickness of the membrane will be smaller than in the case of linear system.

Consider an example in FIG. 14 in which $\Delta z_1 = 0$, i.e., where the system is at rest. Then, at the rest:

$$\Delta z_1 = 0 \text{ and } \Delta z = 0 \quad (144\text{ a,b})$$

and the thickness is limited only by the diameter, d, as in Eq. (126), where:

$$l = nd \quad (145)$$

Applying $x = 1.5$, as before, and assuming the thickness, d, is equal to 1 mil. Then R=1.5 mil, and using a linear thickness of 1 cm as before, the number of turns, n, can be determined as:

$$n = \frac{1 \text{ cm}}{2\, \pi R} = \frac{1 \text{ cm}}{2\, \pi \times 1.5 \text{ mil}} = \frac{10^4 \, \mu m}{2\, \pi \times 1.5 \times 25.4 \, \mu m} = \frac{10 \, \mu m}{239 \, \mu m} = 42 \quad (146)$$

Thus, at rest, the membrane thickness, $$l = nd = 42 \times 25.4 \ \mu m \approx 1000 \ \mu m = 1 \ mm \quad (147)$$

i.e., about 10-times less than in the linear case.
The precise value is:

$$\frac{2 \pi R}{d} = 2 \ \pi x = 2 \ \pi \times 1.5 = 9.42 \quad (148)$$

Therefore, a compactness factor, C, can be introduced in the form:

$$C = 2 \ \pi x = \frac{2 \ \pi R n}{dn} = 9.42. \quad (149)$$

Where $2\pi Rn$ is a linear module thickness, while $dn$ is the shear module thickness.

Thus, in some embodiments, in the case of shear modulus, an excellent compactness factor can be achieved (about 10). Therefore, embodiments including shear modulus are also configurable to provide favorable product characteristics. For example, the MSM coat may be much thinner, almost un-noticeable, in such embodiments.

Example 14. Method of Designing MSM Materials

Embodiments described herein disclose examples of materials that can be used for MSM non-electrical batteries. In various embodiments, string material that can be implemented for MSM purposes (i.e. MSM material), also includes a designed elasticity, $\varepsilon$, parameter. This is easiest to explain for the linear case, where it is expected to reach the highest $\varepsilon$-value possible. An ideal case would be a kind of MSM material with a Young's modulus of steel, a material density of plastic (i.e., $\rho=1.1$ g/cm$^3$) and the highest elasticity. Claim this material. Then, by applying the $\eta$-equation for $\alpha=5\%$, yields the following:

$$\eta_1 = \frac{\varepsilon^2 H}{2\rho_1(1+\alpha)} = \frac{(0.6)^2 \cdot 2 \cdot 10^{11} \ N/m^2}{2 \cdot 1.1 \ g/cm^3 (1+0.05)} =$$

$$= \frac{0.16 \cdot 2 \cdot 10^{11} \ N/m^2}{2 \cdot 10^3 \ kg/m^3 (1.05)} = 0.15 \cdot 10^8 \ N \cdot m/kg = \quad (150)$$

$$= 1.5 \cdot 10^7 \ N \cdot m/kg = 4166 \ wh/kg$$

indeed, very good result.

Thus, in extreme conditions, the energy efficiency of embodiments of the MSM system can be 7.5-times larger than the highest energy efficiency an electrical system (which, in extreme conditions, is 553 Wh/kg).

Embodiments can also be configured to be much larger than a counterpart electrical battery and still having a higher energy capacity per kilogram. For example, embodiments can be 40-times larger than electrical battery baseline (100 Wh/kg).

As described above with reference to Eq. (83), the energy efficiency for a linear application is given by:

$$\eta_2 = \frac{E^2 H}{2\rho} \quad (151)$$

Where $\eta$ is the energy efficiency in kWh/kg, H is Young's modulus (stiffening) in N/m$^2$, or Pascal (Pa), $\rho$ is the material density, in g/cm$^3$, or 10$^3$ kg/m$^3$. This formula can be derived based on an infinitesimal approximation of the non-electrical battery elements—i.e., under the assumption that a group of strings or other textures can be modeled as one uniform, homogeneous, mass of "brush" of fibers/strings, with length, x, extended to x+$\Delta$x where:

$$\varepsilon = \left(\frac{\Delta x}{x}\right)_{MAX} \quad (152)$$

where $\varepsilon$ is the elasticity coefficient, in $\Delta x/x$, where x is the length, or thickness, of the texture and $\Delta x$ is a reversible extension of length of the texture object.

Figure 16:
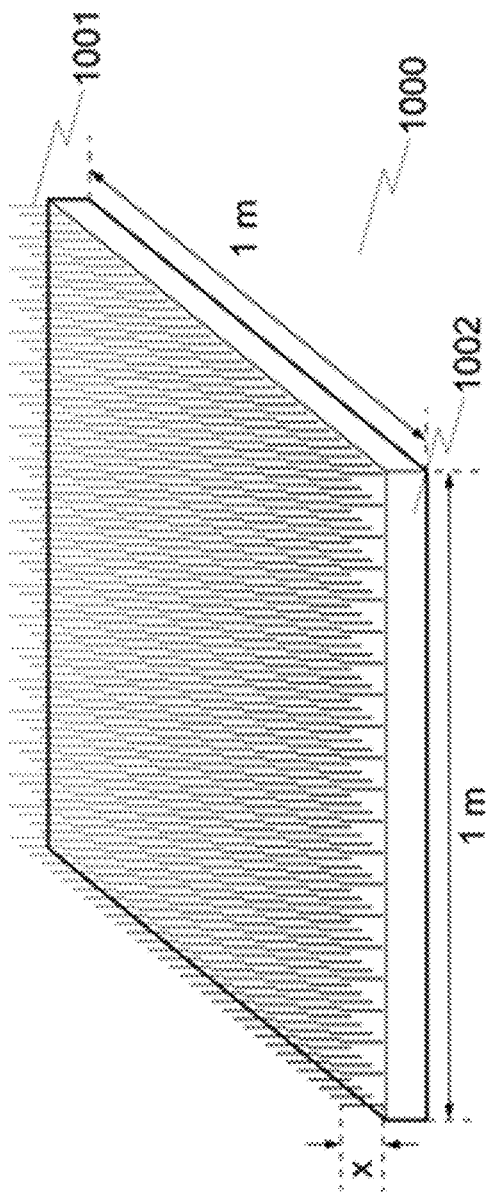
FIG. 16 Figure illustrates an example of a linear non-electrical battery module in the form of membrane, with a matrix of strings in accordance with one embodiment.

An example of this is shown in FIG. 16, which illustrates an example of a Linear Module in the form of membrane, with a matrix of strings in accordance with one embodiment. This example is shown upside down to provide a better illustration. FIG. 16 is another representation of the embodiment illustrated in FIG. 8, except, in FIG. 8, the application in a brush configuration is not shown for clarity of illustration, and the length is denoted by l, not by x.

Assume for purposes of discussion that the length of the strings 1001 of this brush 1000 is x=1 cm. In this example, the overall dimensions of the module as defined by the geometry of membrane 1002 are 1 m×1 m. In preferred embodiments, the strings 1001 of the battery should be small. Accordingly, in various embodiments, MEMS technology can be used to implement the non-electrical battery using a submicron scale. For example, embodiments can be implemented in which the dimensions of the strings 1001 as the textural membrane resemble the dimensions of the biologic structures as shown in FIG. 13.

Figure 17:
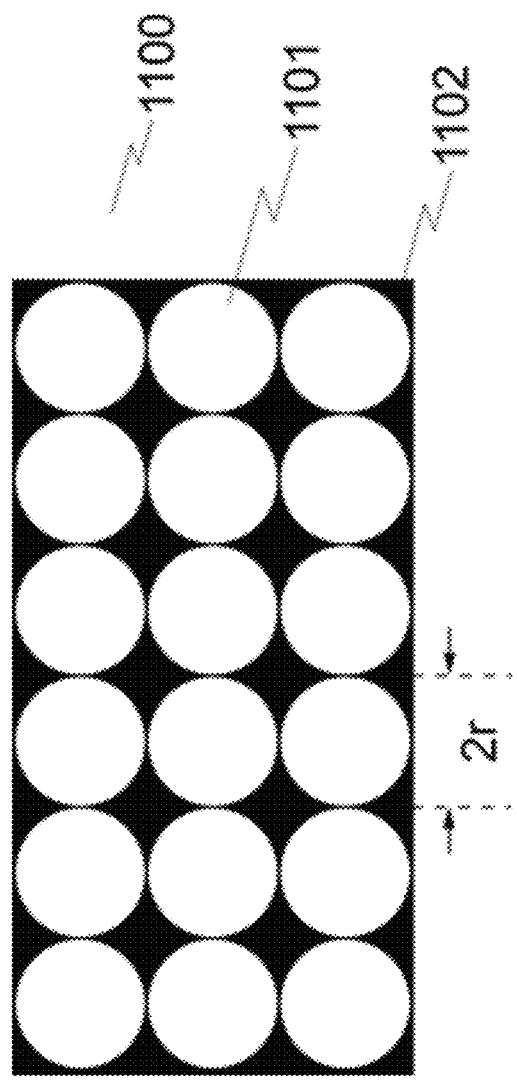
FIG. 17 is a diagram illustrating an example of a cross sectional representation of a plurality of strings in accordance with one embodiment.

The scale of the strings (or other textural elements) in MEMS configurations can provide higher levels of efficiency than larger scale implementations, assuming that the empty space between the string elements is small—in some embodiments, a small as practically achievable. FIG. 17 is a diagram illustrating an example of a cross sectional representation of a plurality of strings in accordance with one embodiment. In this example 1100, the cross-sectional areas 1101 of a plurality of strings is shown on with the corresponding empty spaces 1102 between the strings. The area of each cross-section 1101 of the strings is equal to $\pi r^2$, and they are tangential to squares with areas equal to $4r^2$. Thus, the empty spaces 1102 are equal to $4r^2 - \pi r^2$.

Embodiments may be implemented with strings of a reduced or minimal cross-sectional area to improve efficiency. With the decreasing diameter of the strings the area of the empty spaces 1102 become smaller, tending to zero. As the diameter of the strings are reduced by a factor of n, as the diameter approaches zero, n→∞:

$$\lim_{n \to \infty} \left(\frac{4r^2 - \pi r^2}{n^2}\right) = 0 \quad (153)$$

Therefore, indeed, an infinitesimal approximation in the case of Eq. (400) means that it is preferable in some embodiments to provide implementations with dimensions of the strings being as small as possible. Accordingly, the implementation using MEMS technology and the analogy to the biologic structures is not here accidental (see FIG. 13).

In various embodiments, implementing the battery with textures at least roughly in the shape of strings is preferable over other shapes for purposes of improving efficiency of the MEMS non-electrical battery. An example of this can be illustrated by comparing the example of FIG. 3 with the example of FIG. 8. The importance of the shape of the textural element used in the non-electrical battery can be described by referring to Eq. (403), below:

$$k = \frac{H \cdot S}{\ell}. \tag{154-1}$$

The potential energy stored in the non-electrical battery can be given by:

$$Ep = \frac{k\Delta x^2}{2}. \tag{154-2}$$

Therefore, as seen by Eq. (403), maximizing the string constant, k, maximizes the potential energy that can be stored by the battery. Because the surface area, S, is in the numerator of Eq. (403), increasing the surface area, S, increases the string constant, k. Therefore, the surface area in non-electrical battery applications is preferably as large as practically possible to increase the potential energy that can be stored by the battery. Accordingly, in some embodiments, the textures, or strings, are woven or otherwise formed into a membrane having a large surface area. For example, as described above, in one embodiment a non-electrical battery is formed into the shape of a fabric which itself can be integrated with or formed into the shape of a garment such as a coat, a shirt, a scarf or other apparel. In further examples, the non-electrical battery can be formed into sheets or fabrics for other applications such as, for example, seat covers and headliners for vehicles; curtains, shades and carpets; sheets and blankets; liners; and other shapes into which texture such as strings can be woven or otherwise formed.

Additionally, in various embodiments the size of membrane may be limited so that the membrane does not exceed certain maximum weight restrictions that may be placed on the non-electrical battery given the application. Consider an example in which the weight of the non-electrical battery does not exceed 10 kg and consider a human-shaped robot as baseline. With a thin membrane size (thin relative to its length and width) of approximately 1 m×1 m×1 cm:

$$m = v\rho = 1 \text{ m} \times 1 \text{ m} \times 1 \text{ cm} \times 1 \text{ g/cm}^3 = 1 \text{ m} \times 1 \text{m} \times 10^{-2} \text{ m} \times 10^3 \text{ kg/m}^3 = 10 \text{ kg} \tag{155}$$

Example 15. Efficiency of Gasoline

Assume the following facts about the energy consumption of a gasoline-powered passenger car:

1) It takes 6 kWh of energy to for a gasoline powered car to travel 25 miles on a freeway at freeway speeds; and
2) It takes 9 gallons of gasoline for the same car to travel 300 miles on the same freeway.

Given these approximations, what is the efficiency, q, in Wh/kg of gasoline? To determine the answer, first consider that 1 gal of liquid≅3.79 liters, and the density of water is approximately $\rho \cong 1000$ kg/m³ or 1 kg/L. Therefore, the mass of 1 L of water is 1 kg. The mass of 1 L of gasoline is slightly less than that of water because the density of gasoline is from 720 kg/m³ to 760 kg/m³ at 20° C., or approximately 7.4 kg/L. Therefore, 9 gallons of gasoline=approximately 25 kg leading to an efficiency, η, in this example of:

$$\eta = \frac{6 \text{ kWh}}{25 \text{ miles}} \times \frac{300 \text{ miles}}{25 \text{ kg}} = 2.88 \text{ kWh/kg}, \tag{156}$$

which is a much larger value than for electrical batteries, which have a baseline of about 100 Wh/kg).

Example efficiencies for conventional electrical batteries are given in the following table, with the caveat that actual efficiencies may vary depending on the manufacturer and the actual materials used.

| Battery Type | Wh/kg |
| --- | --- |
| Lead-acid | 41 |
| Alkaline long-life | 110 |
| Carbon-zinc | 36 |
| NiMH | 95 |
| NiCad | 39 |
| Lithium-ion | 128 |
| Lithium Thionyl Chloride | 700 |

Example 16. Efficiency of Carbon Fiber

Consider an example using carbon fiber (not graphene which is currently too expensive, but may become affordable over time) with a Young's modulus of H=1.2·10¹¹ N/m² and $\rho = 1.57 \cdot 10^3$ kg/m³. Then, we have: (ε=0.4):

Therefore, the efficiency of carbon fiber is:

$$\eta = \frac{\varepsilon^2 H}{2\rho} = \frac{0.16 \cdot 1.2 \cdot 10^{11}}{2 \cdot 1.57 \cdot 10^3} = 0.06 \cdot 10^8 \tag{157}$$
$$= 6 \cdot 10^6 \text{ Wsec/kg} = 1666 \text{ Wh/kg} = 1.666 \text{ kWh/kg}$$

which is a very high value, as compared with that of gasoline (2.88 kWh/kg).

This new battery is not only a non-electrical battery one may also be a mechanical battery. Accordingly, in some embodiments an electrical turbine or motor or other mechanism to transform electrical energy into mechanical energy can be eliminated. Such embodiments can be implement to only transform the stored potential energy of the battery, Ep, into kinetic energy, Ek. The following conservation of energy principle (ignoring energy dissipation) shows:

$$E_p + E_k = \frac{kx^2}{2} + \frac{mv^2}{2} = \text{CONSTANT} \tag{158}$$

As described above, in various embodiments the non-electrical battery may be charged using a simple device mechanical, similar to an arbalest (analogous to a turbine) to store potential energy. At that point, the battery (e.g., the human-like robot powered by a MEMS non-electrical battery) is charged. After that, such a robot is autonomous; it can make independent movement, such as moving its arms, legs, etc. Accordingly, the robot (or other instrumentality with the non-electrical battery) needs to have kinetic energy for such movement. Therefore, the non-electrical battery can include a mechanism for releasing the stored potential energy into proper value of kinetic energy.

Figure 18:
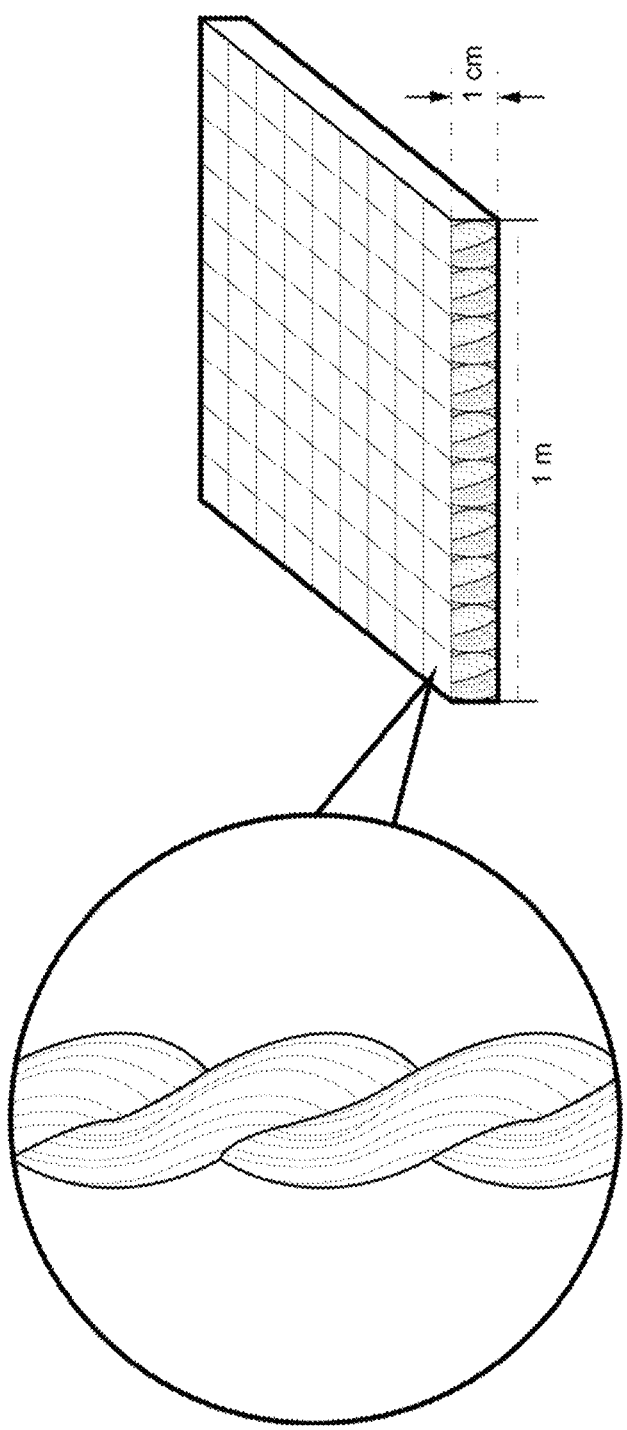
FIG. 18 is a diagram illustrating a close-up of textures in an example MSM non-electrical battery in accordance with one embodiment of the technology described herein.

FIG. 18 is a diagram illustrating a close-up of textures in an example MSM non-electrical batter in accordance with one embodiment of the technology described herein. In this example, the textures are strings. More particularly, in this example each texture is a twisted pair of strings and the textures are arranged in a matrix of rows and columns similar to that illustrated in the example of FIG. 8.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A non-electrical battery, comprising:
a linear surface;
a plurality of strings disposed in parallel relation on the linear surface, each string comprising a first end and a second end, wherein the first end of each string is attached to the linear surface and each string extends away from the linear surface; and
a mechanical energy device attached to the second end of each string to apply a tension to the strings to increase a potential energy stored by the strings, wherein the amount of tension applied to a string of the plurality of strings extends the string by an amount within the range of 0.75·A to A, where A=ε·l, wherein ε is an elasticity of the string and l is the unstretched length of the string.

2. The non-electrical battery of claim 1, further comprising a second surface, wherein the second end of each string is attached to the second surface; and wherein the mechanical energy device is indirectly attached to the second end of each string via the second surface.

3. The non-electrical battery of claim 1, wherein ε is in the range of 0.1-0.5.

4. The non-electrical battery of claim 1, wherein ε is in the range of 0.4-0.5.

5. The non-electrical battery of claim 1, wherein the potential energy stored by the strings is $$E = \frac{kA^2}{2} = \frac{k\varepsilon^2 l^2}{2},$$

where k is a string constant.

6. The non-electrical battery of claim 1, wherein ε is given by $$\varepsilon = \left(\frac{\Delta x}{x}\right)_{MAX}.$$

7. The non-electrical battery of claim 1, wherein a plurality of mechanical devices are attached to a second end of each string of the plurality of strings.

8. The non-electrical battery of claim 1, wherein the strings comprise at least one of graphene, carbon fiber, plastic, steel, and nylon.

9. The non-electrical battery of claim 1, wherein the strings comprise a plurality of filaments, wherein one of the filaments comprises at least one of graphene, carbon fiber, plastic, steel, and nylon.

10. The non-electrical battery of claim 1, wherein the efficiency of the battery is in the range of $\eta_2 = 0.9$ kWh/kg to $\eta_2 = 1.1$ kWh/kg.

11. The non-electrical battery of claim 1, wherein the strings comprise a material having an elasticity, ε, of 0.4, a material density of ρ=1.1 g/cm³, and a Young's modulus of $30\cdot10^{11}$ N/m².

12. The non-electrical battery of claim 1, wherein the strings comprise a material having an elasticity of E in the range of 0.3 to 0.8, a material density of p in the range of 0.7 to 1.4 g/cm³, and a Young's modulus in the range of $2\cdot10^{10}$ to $3\cdot10^{11}$ N/m².

13. The non-electrical battery of claim 1, wherein the efficiency of the battery is in the range of 1 to 20 kWh/kg.

14. The non-electrical battery of claim 1, wherein the strings are arranged in a matrix to form a membrane having a length and a width, wherein the length is between 80 and 120 times the length of each string and the width is between 10 and 120 times the length of each string.

15. The non-electrical battery of claim 14, wherein the non-electrical battery is formed in the shape of a panel of fabric.

16. The non-electrical battery of claim 1, wherein the strings and linear surface are arranged to form a membrane having a length and a width greater than a thickness, and wherein the non-electrical battery is formed into a sheet or fabric.

17. The non-electrical battery of claim 16, wherein the sheet or fabric is formed into a panel of an article of clothing, a seat cover a vehicle headliner, a curtain, a shade a carpet, bedding, or a liner.

18. The non-electrical battery of claim 1, wherein the length of the strings is in the range of 0.8 to 1.1 cm, the strings have a Young's modulus in the range of $10^{11}$ N/m² to $2\cdot10^{11}$ N/m².

19. The non-electrical battery of claim 1, wherein the length of the strings is in the range of 0.8 to 1.1 cm, the strings have a Young's modulus in the range of $2.10^9$ N/m² to $2.3\cdot10^9$ N/m².

20. The non-electrical battery of claim 19, wherein the strings are arranged in a matrix to form a membrane having a surface area between 0.8 and 1.2 m².

21. The non-electrical battery of claim 1, wherein the strings are arranged in a matrix to form a membrane having a length, a width and a thickness of dimensions such that the non-electrical battery is in the form of a sheet-like structure.

22. The non-electrical battery of claim 1, wherein the energy that can be stored in the non-electrical battery is a function of an elasticity coefficient of the string material.

23. The non-electrical battery of claim 1, wherein the energy that can be stored in the non-electrical battery is given by $$E = \frac{HS\varepsilon^2 \ell}{2},$$

where H is the Young's modulus of the strings, S is the surface area, ε is the elasticity of the strings, and l is the length of the strings.

24. The non-electrical battery of claim 1, wherein the efficiency of the non-electrical battery is a function of an elasticity of the strings.

25. The non-electrical battery of claim 1, wherein the efficiency of the non-electrical battery is given by $$\eta = \frac{\frac{\varepsilon^2 \ell^2}{2} \frac{H \cdot S}{\ell}}{\frac{\rho S \cdot \ell}{1}} = \frac{\varepsilon^2 H}{2} \frac{1}{\rho} = \frac{\varepsilon^2 H}{2\rho},$$

where H is the Young's modulus of the strings, ε is the elasticity of the strings, and ρ is the material density of the strings g/cm³.

26. The non-electrical battery of claim 1, wherein the strings comprise a plastic.

27. The non-electrical battery of claim 1, wherein the strings comprise a composite plastic with a Young's Modulus greater than $10^{10}$ N/M².

28. The non-electrical battery of claim 1, wherein the strings each comprise a plurality of filaments and the filaments comprise two or more materials chosen from the group of plastic, steel, graphene, butyl rubber, neoprene, polyurethane, plexiglass, vinyl, and nylon.

29. The non-electrical battery of claim 1, wherein a natural resonant frequency of the strings is sufficiently far from a frequency of vibrations encountered by the non-electrical battery such that the vibrations encountered do not interfere with energy storage of the strings in the non-electrical battery.

30. The non-electrical battery of claim 1, wherein the strings of the non-electrical battery have a resonant frequency in the range of 18-25 kHz.

31. The non-electrical battery of claim 1, wherein the non-electrical battery has a resonant frequency in the range of 3 kHz-1.1 Mhz.

32. The non-electrical battery of claim 1, wherein the non-electrical battery has a resonant frequency given by $$\omega_o^2 = \frac{H}{\rho \cdot \ell},$$

where H is the Young's modulus of the strings, ρ is the material density of the stings and l is the length of the strings.

33. The non-electrical battery of claim 1, wherein the strings are wound in a winding of radius, R forming coils in parallel.

34. The non-electrical battery of claim 33, wherein the energy that can be stored in the non-electrical battery is given by $$E_2 = \frac{NGd^6 \varepsilon^2 n}{128 R^3},$$

where ε is the elasticity of the strings, d is the diameter of the strings, n is the number of turns in the windings, N is the number of strings and G is the shear modulus of the windings.

35. The non-electrical battery of claim 1, wherein the energy that can be stored by a string in the non-electrical battery is governed only by material constants of the string.

36. The non-electrical battery of claim 1, wherein the strings comprise material with a Young's modulus in the range of $2 \cdot 10^7$ N/m² to $2.3 \cdot 10^{11}$ N/m², a material density in the range of 0.8 g/cm³-1.3 g/cm³ and an elasticity in the range of 0.1 to 0.6.

37. The non-electrical battery of claim 36, the efficiency for $\alpha=5\%$, is:

$$\eta_1 = \frac{\varepsilon^2 H}{2\rho_1(1+\alpha)} = \frac{(0.6)^2 \cdot 2 \cdot 10^{11} \text{ N/m}^2}{2 \cdot 1. \text{ g/cm}^3 (1+0.05)} =$$
$$= \frac{0.16 \cdot 2 \cdot 10^{11} \text{ N/m}^2}{2 \cdot 10^3 \text{ kg/m}^3 (1.05)} = 0.15 \cdot 10^8 \text{ N} \cdot \text{m/kg} =$$
$$= 1.5 \cdot 10^7 \text{ N} \cdot \text{m/kg} = 4166 \text{ Wh/kg}.$$

38. The non-electrical battery of claim 1, wherein the strings comprise material with a Young's modulus in the range of $27 \cdot 10^{11}$ to $32 \cdot 10^{11}$ N/m², a material density in the range of 0.8 g/cm³-1.3 g/cm³ and an elasticity in the range of 0.1 to 0.6.

* * * * *